United States Patent [19]
Aoki et al.

[11] Patent Number: 6,043,528
[45] Date of Patent: *Mar. 28, 2000

[54] SEMICONDUCTOR MEMORY DEVICE HAVING TRENCH-TYPE CAPACITOR STRUCTURE USING HIGH DIELECTRIC FILM AND ITS MANUFACTURING METHOD

[75] Inventors: Masami Aoki, Yokohama; Takeshi Hamamoto, Kanagawa-ken, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/806,247

[22] Filed: Feb. 21, 1997

[30] Foreign Application Priority Data

Feb. 23, 1996 [JP] Japan .................................. 8-036443

[51] Int. Cl.[7] ................................................ H01L 27/108
[52] U.S. Cl. ............................ 257/301; 257/908; 257/305
[58] Field of Search ................................... 257/301–305, 257/905, 908, 71

[56] References Cited

U.S. PATENT DOCUMENTS

| | | | |
|---|---|---|---|
| 4,910,567 | 3/1990 | Malhi | 257/296 |
| 4,914,740 | 4/1990 | Kenney | 257/302 |
| 4,918,500 | 4/1990 | Inuishi | 257/303 |
| 4,922,313 | 5/1990 | Tsuchiya | 257/303 |
| 4,935,380 | 6/1990 | Okumura | 438/301 |
| 5,097,381 | 3/1992 | Vo | 361/313 |
| 5,309,008 | 5/1994 | Watanabe | 257/301 |
| 5,349,218 | 9/1994 | Tadaki et al. | 257/296 |
| 5,352,913 | 10/1994 | Chung et al. | 257/303 |
| 5,508,541 | 4/1996 | Hieda et al. | 257/301 |
| 5,521,407 | 5/1996 | Kohyama et al. | 257/301 |
| 5,555,520 | 9/1996 | Sudo et al. | 257/301 |
| 5,606,188 | 2/1997 | Bronner et al. | 257/304 |
| 5,691,549 | 11/1997 | Lam et al. | 257/282 |

FOREIGN PATENT DOCUMENTS 60-245271  12/1985  Japan .

*Primary Examiner*—Valencia Martin-Wallace
*Assistant Examiner*—George C. Eckert, II
*Attorney, Agent, or Firm*—Oblon, Spivak, McClelland, Maier & Neustadt, P.C.

[57] ABSTRACT

A semiconductor memory device comprises a MOS-type transistor formed on a semiconductor substrate, a capacitor formed in the interior of an opening portion formed in the semiconductor substrate to be adjacent to the MOS-type transistor, the capacitor having a capacitor insulating film formed of a high dielectric film, and a line layer for connecting respective gate electrodes of the MOS-type transistor separated to be island-shaped to prevent from being presented on a region where the opening portion is formed, the line layer formed of a conductive layer different from the gate electrodes in its level.

21 Claims, 27 Drawing Sheets

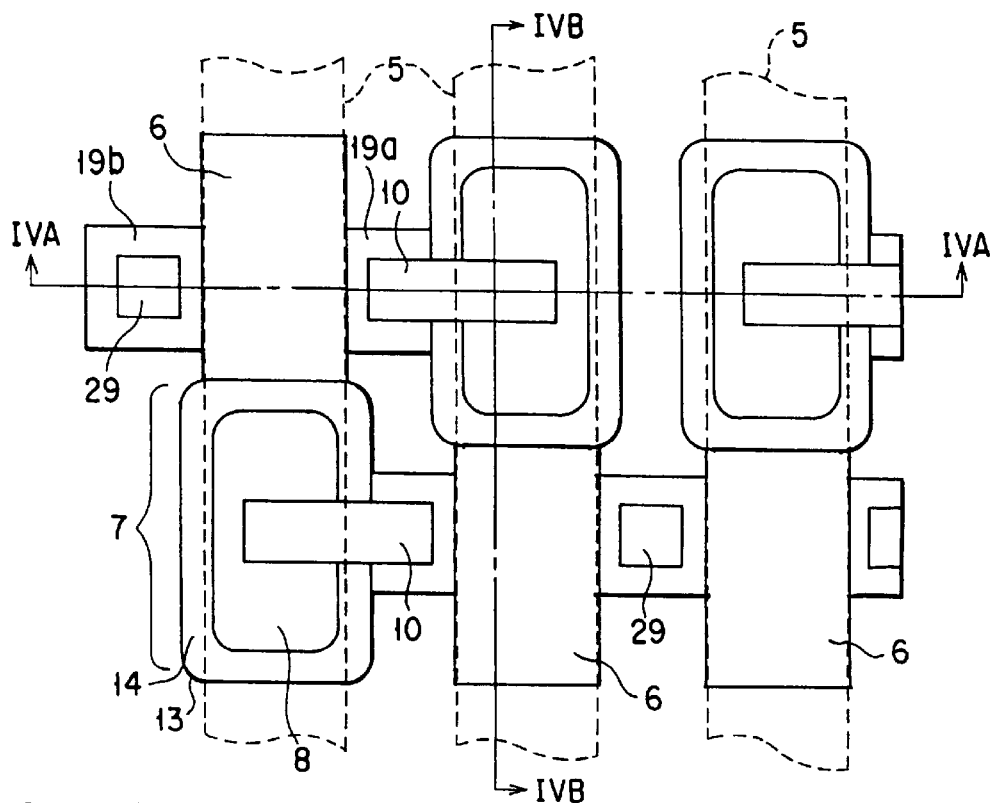
F I G. 3

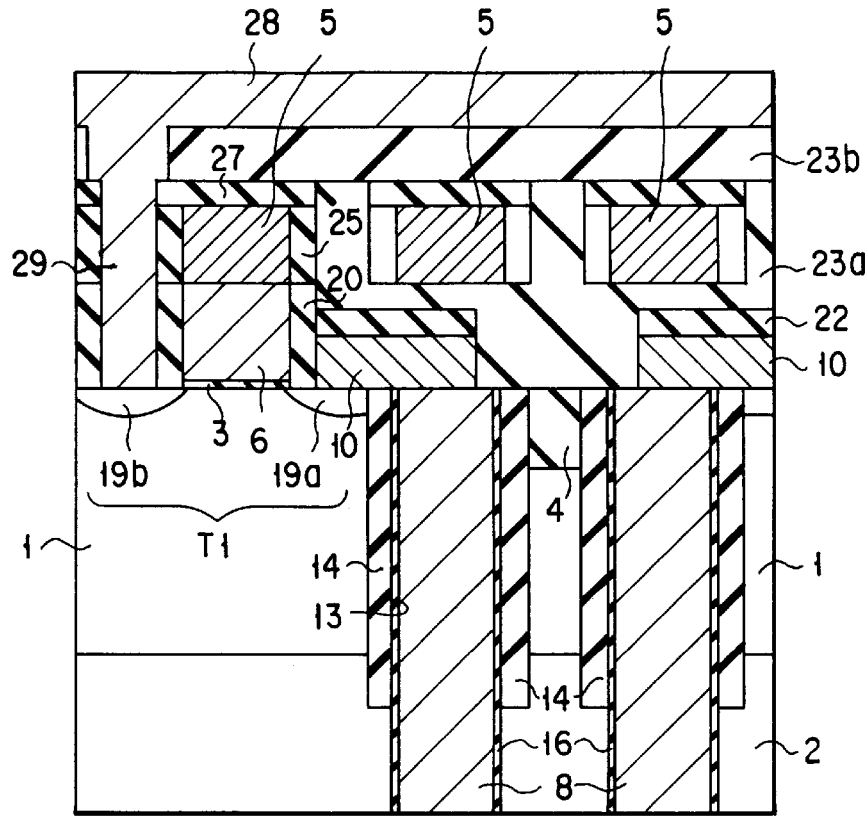
F I G. 4A
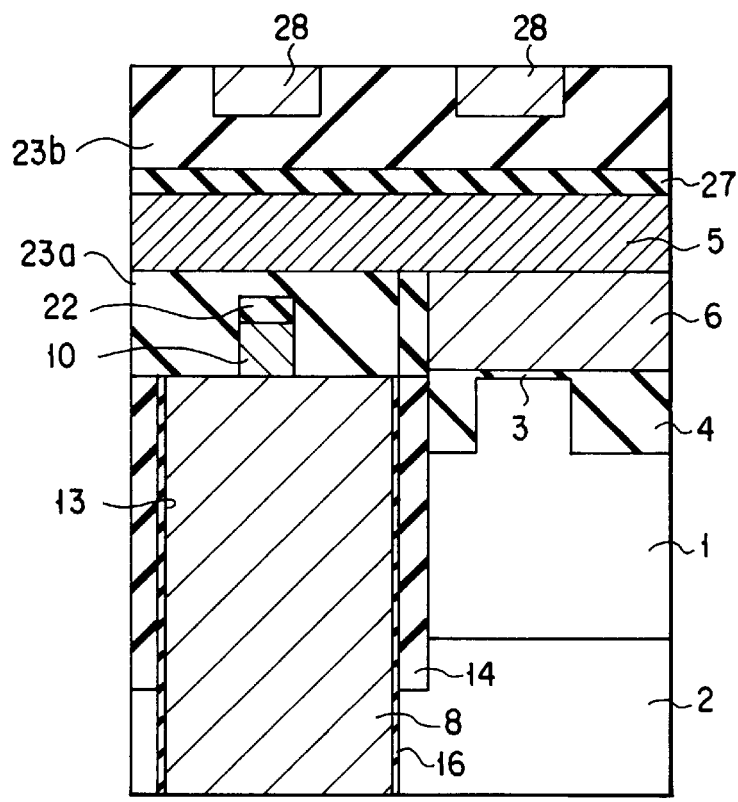
F I G. 4B

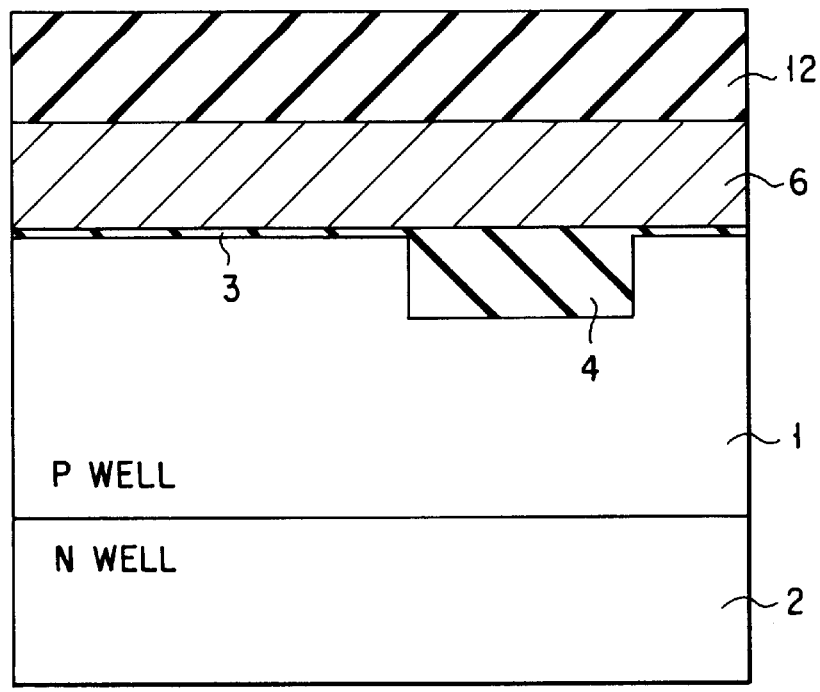
F I G. 5A
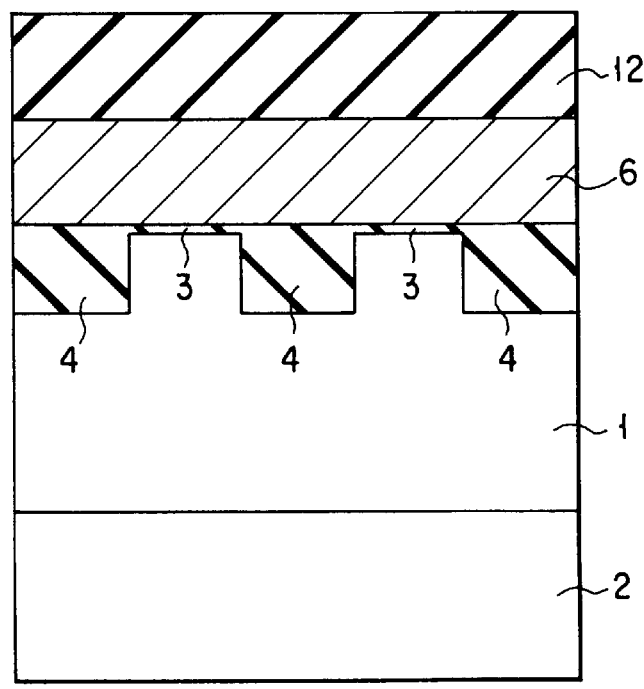
F I G. 5B

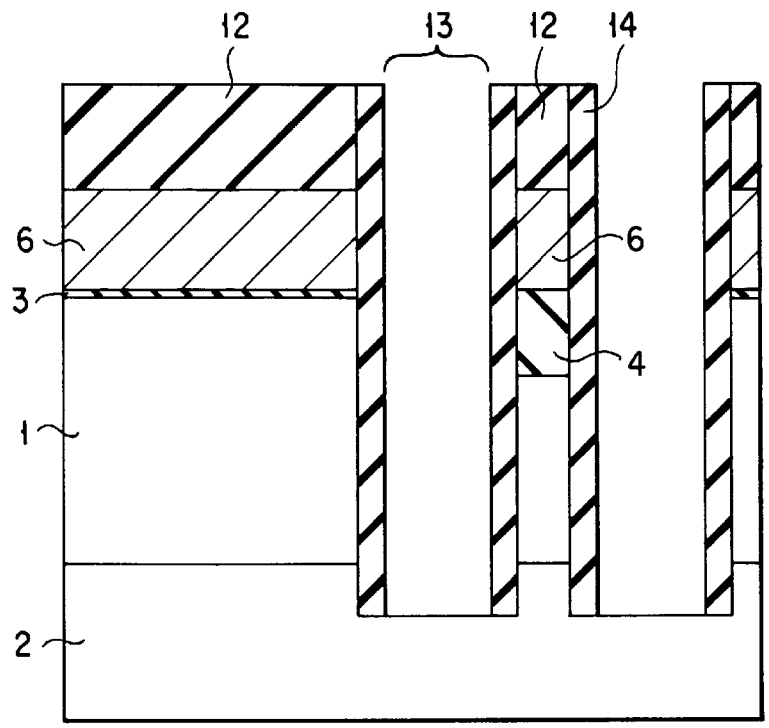
F I G. 6A
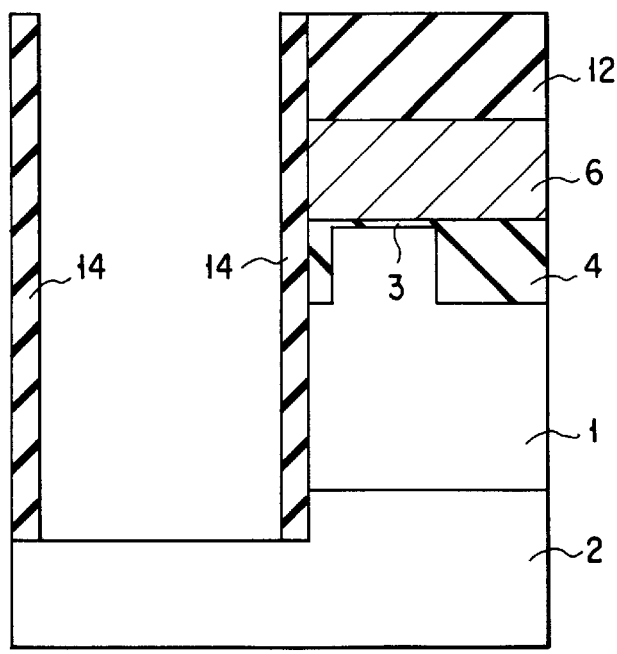
F I G. 6B

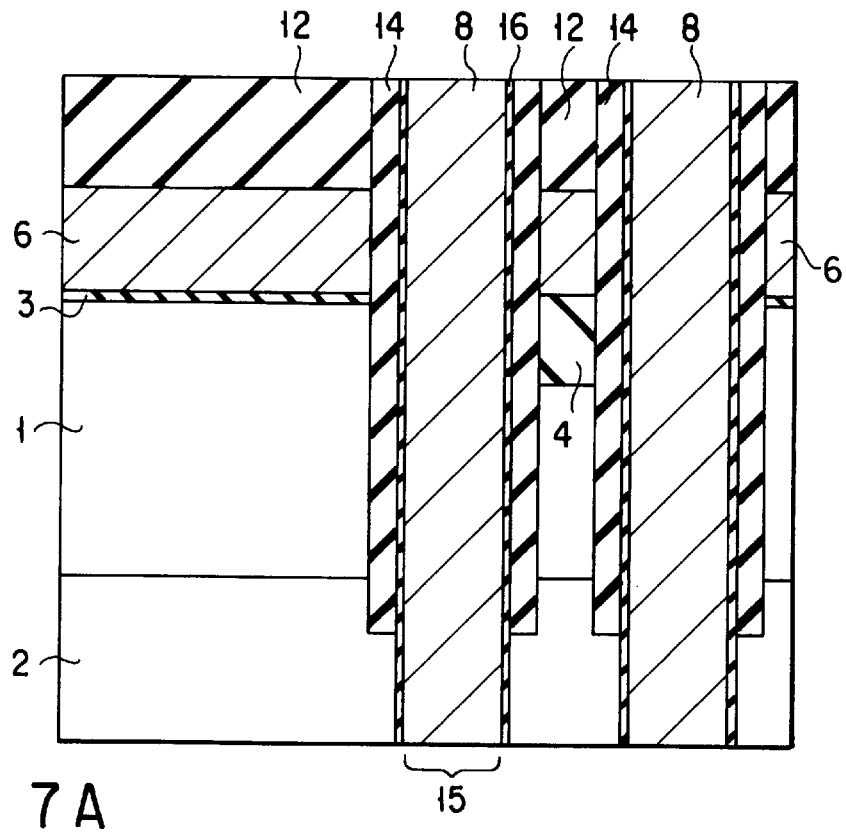
F I G. 7A
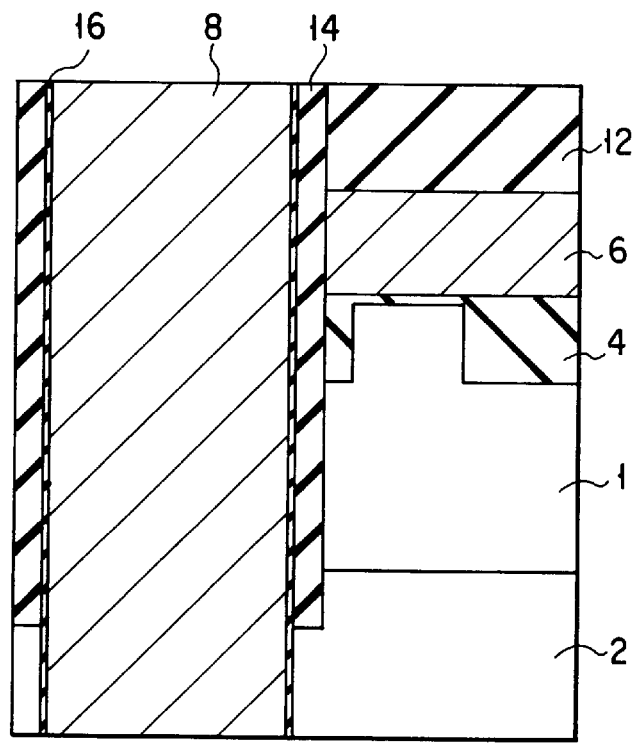
F I G. 7B

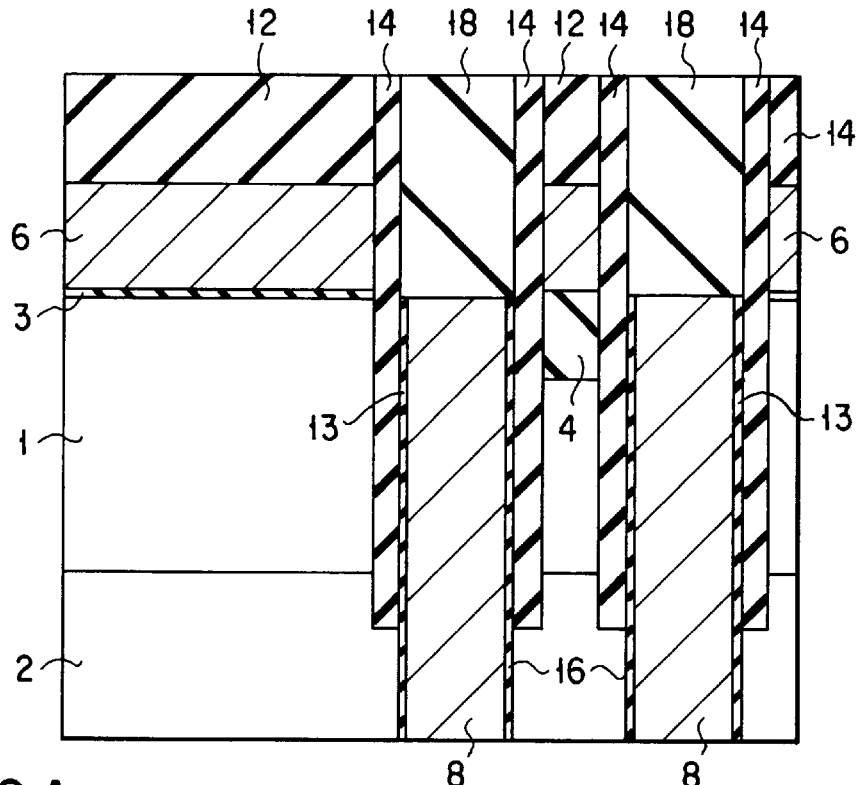
F I G. 8A
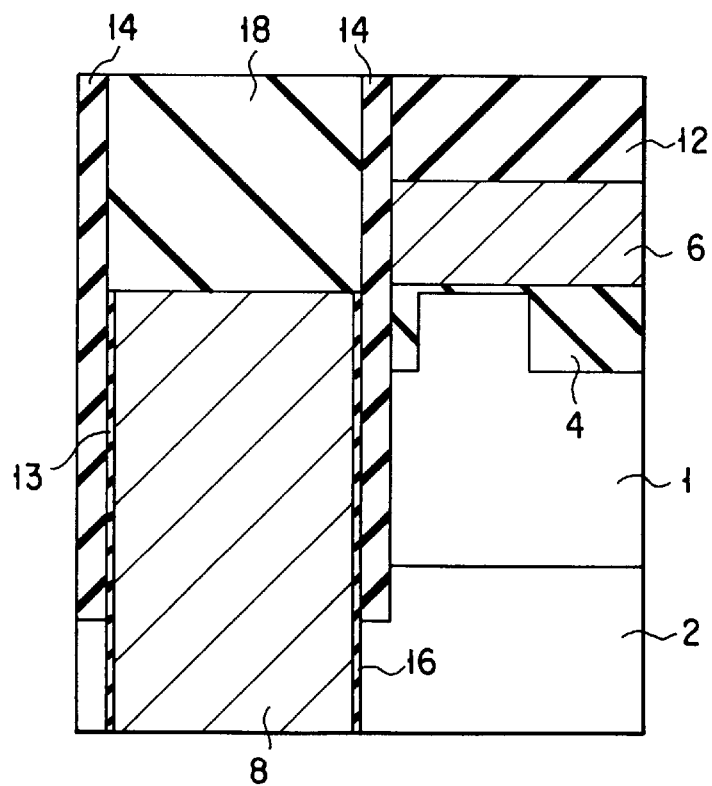
F I G. 8B

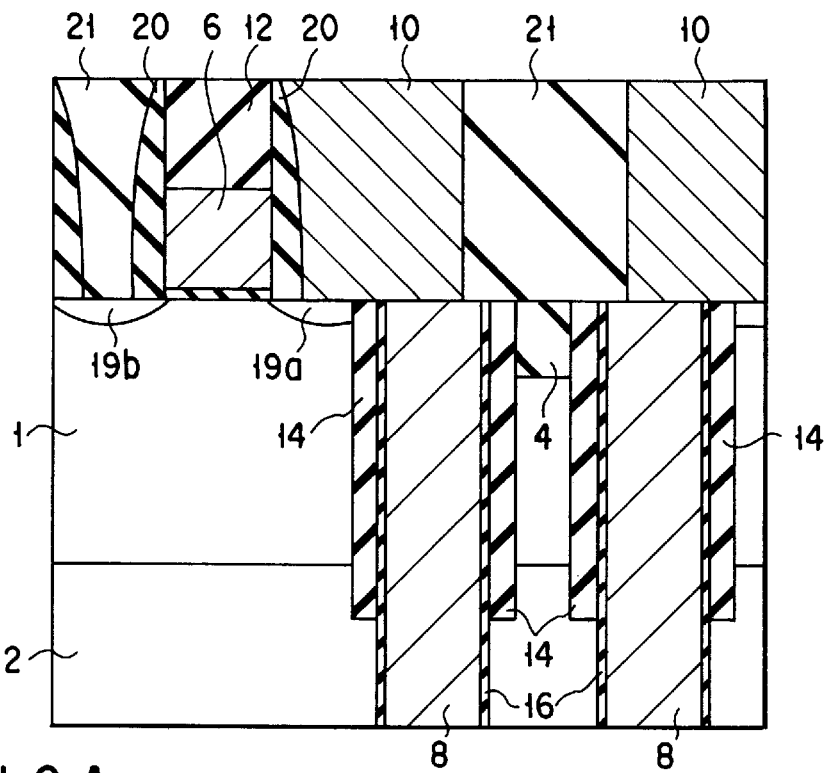
F I G. 10A
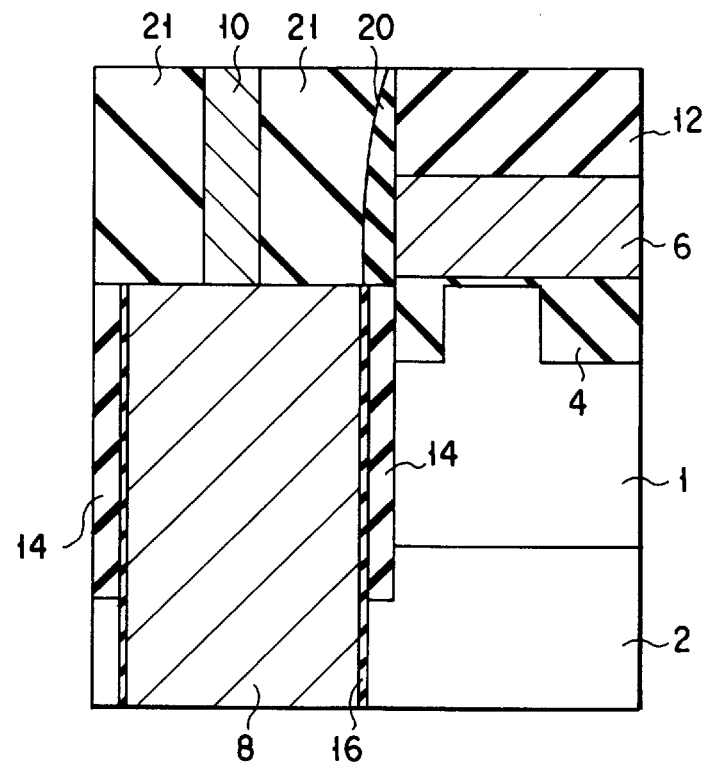
F I G. 10B

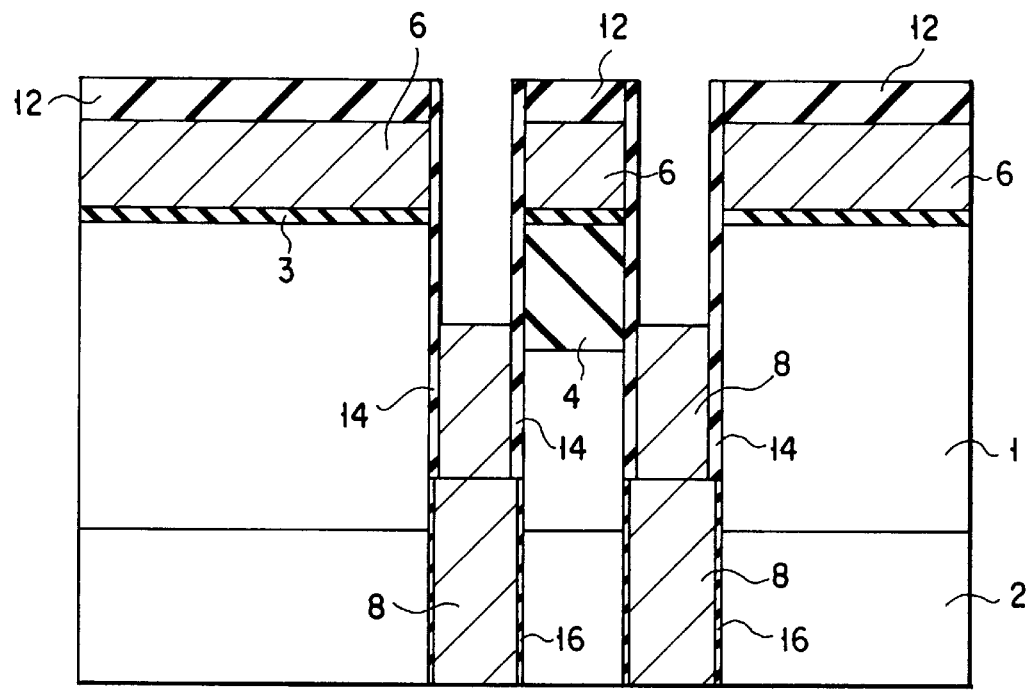
F I G. 23
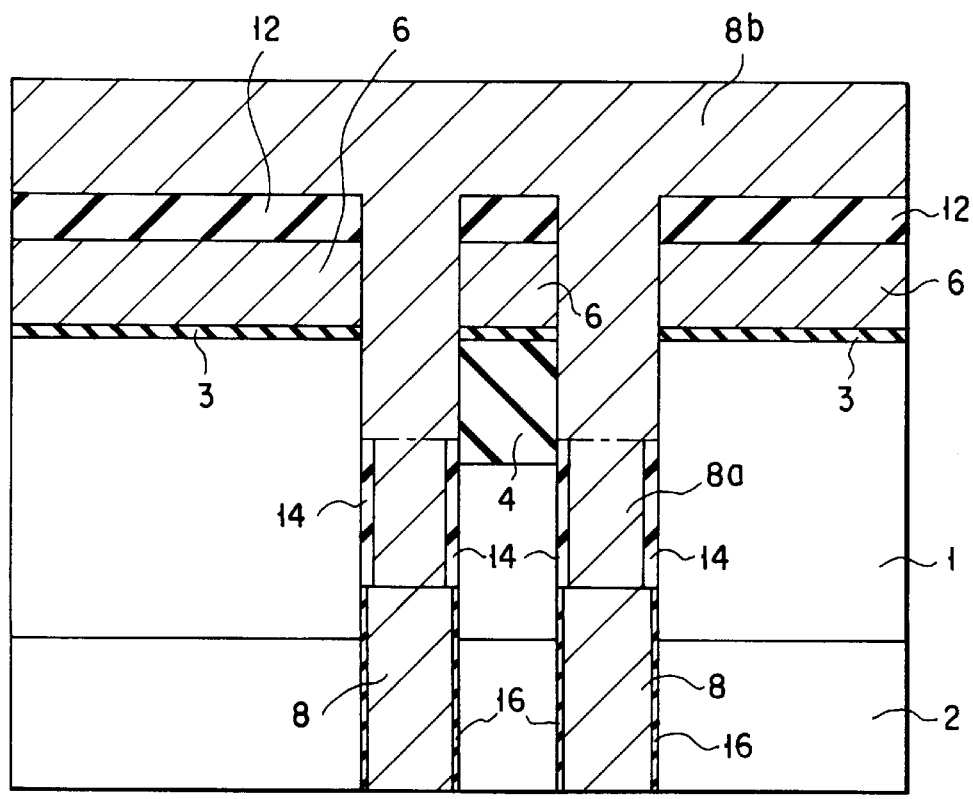
F I G. 24

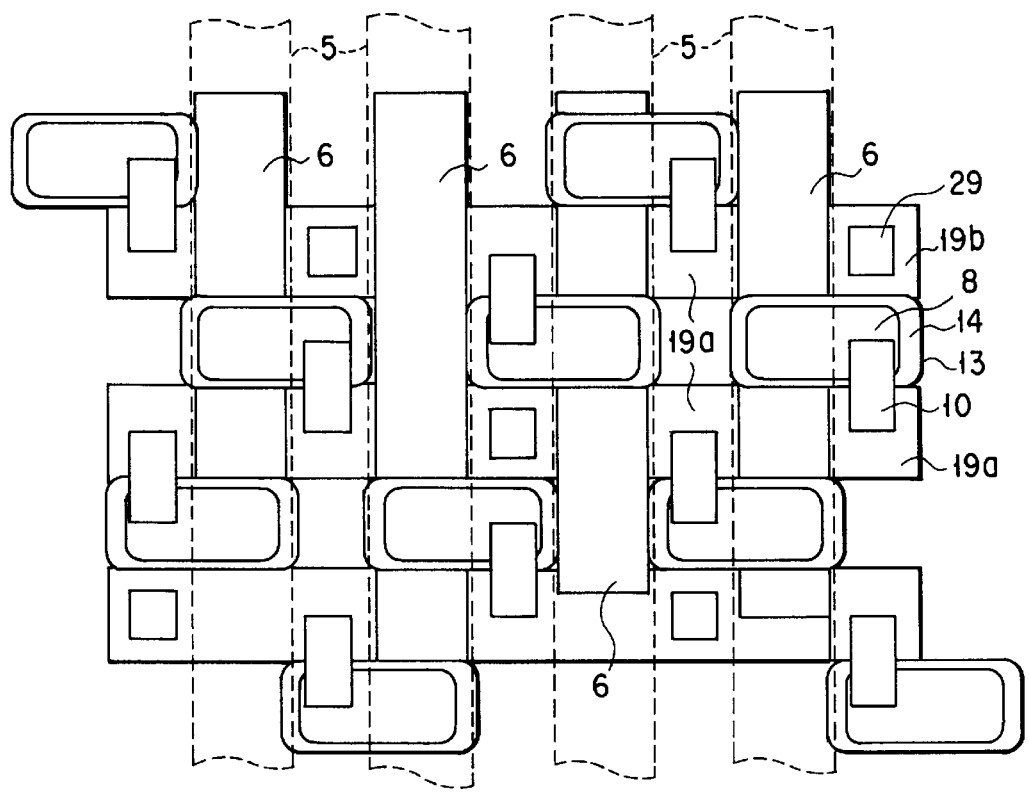
F I G. 29
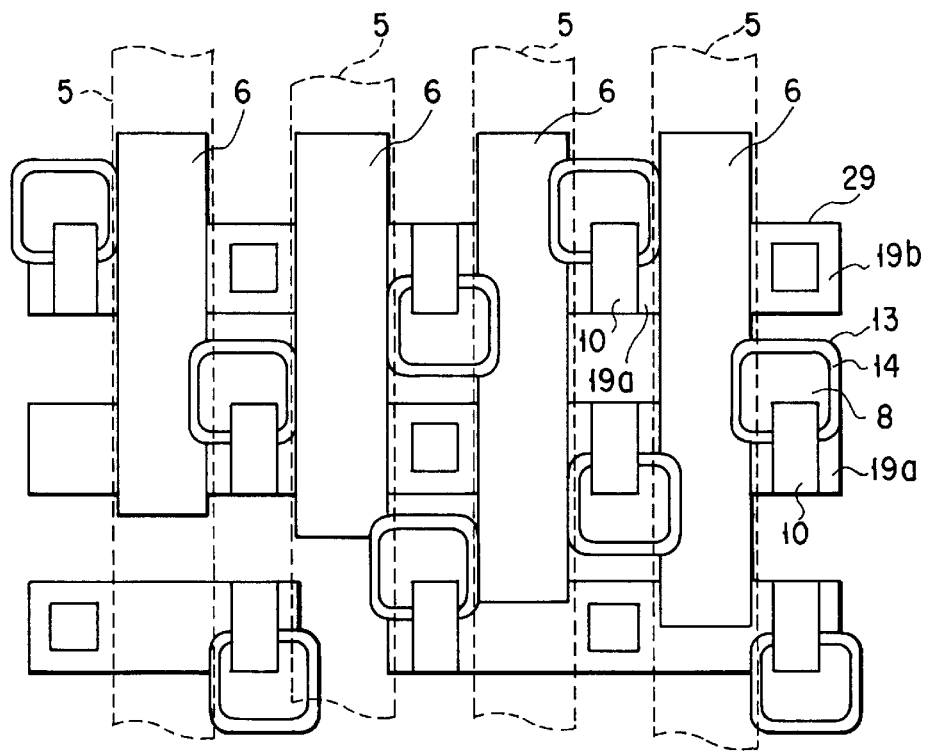
F I G. 30

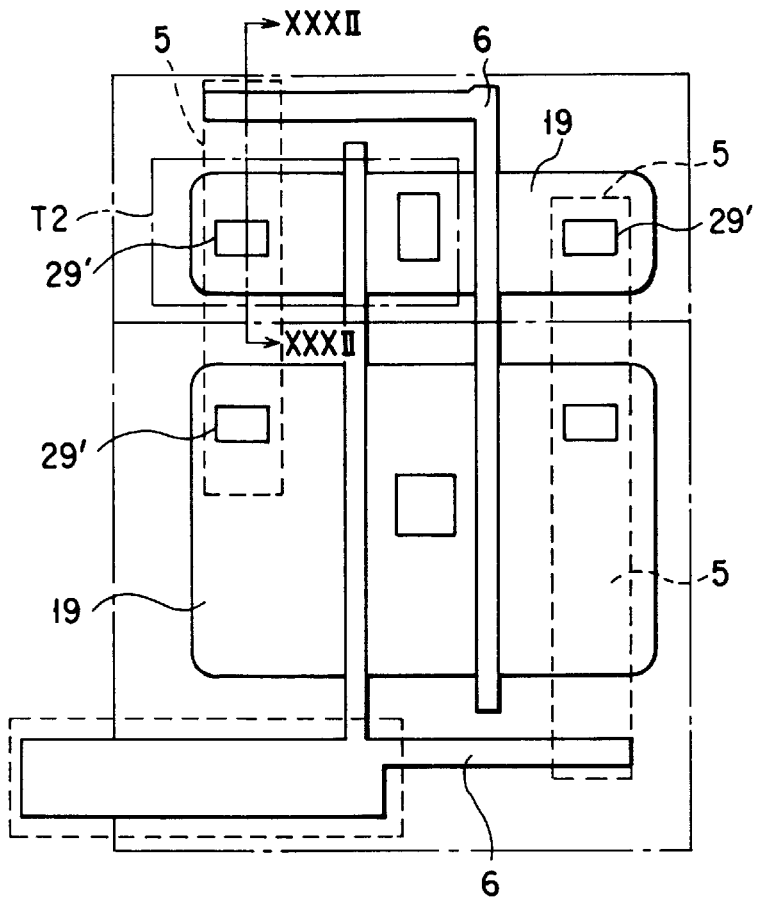
F I G. 31
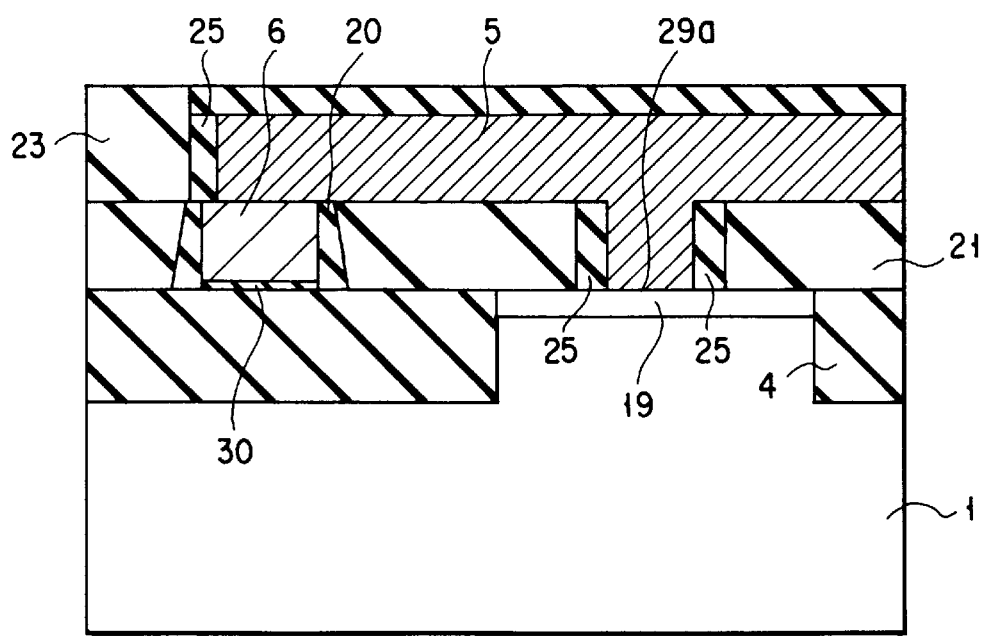
F I G. 32

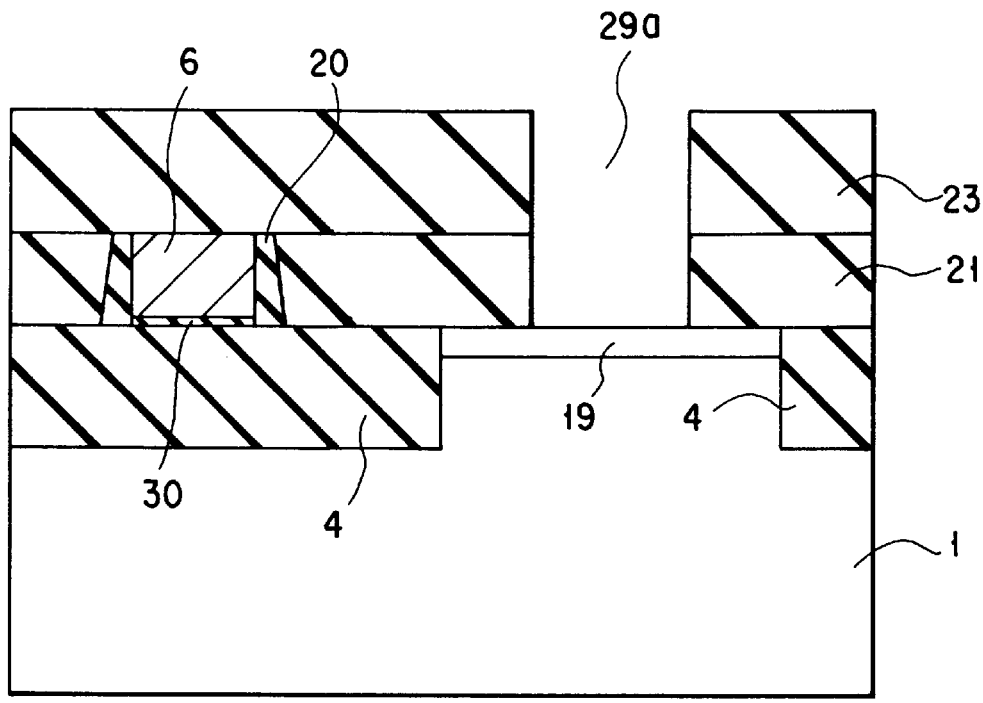
F I G. 33
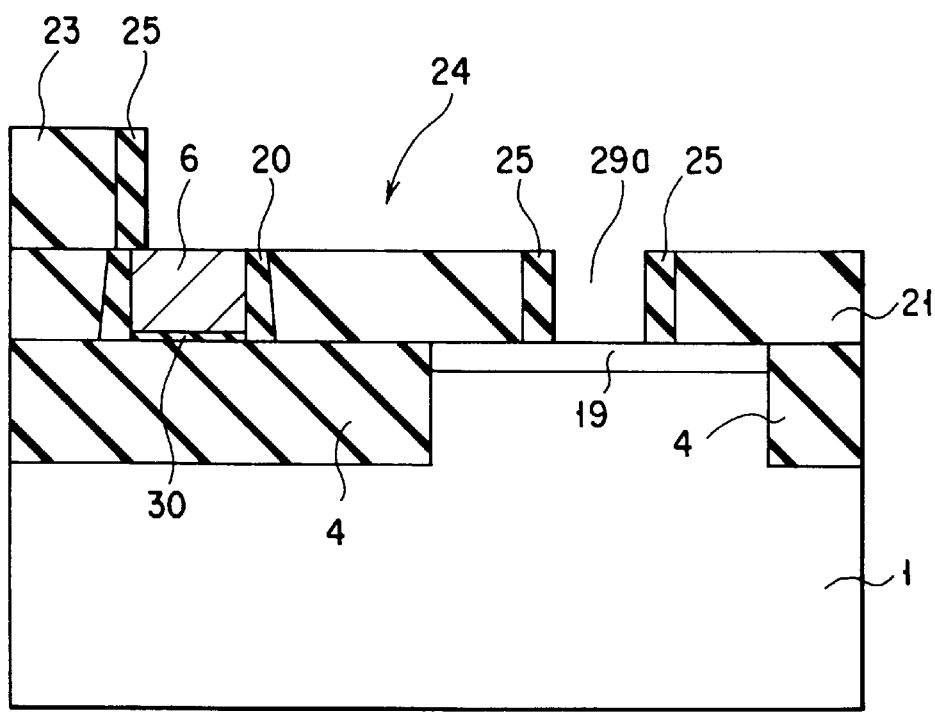
F I G. 34

SEMICONDUCTOR MEMORY DEVICE HAVING TRENCH-TYPE CAPACITOR STRUCTURE USING HIGH DIELECTRIC FILM AND ITS MANUFACTURING METHOD

BACKGROUND OF THE INVENTION

The present invention relates to a semiconductor memory device using a memory cell constituting a storage electrode in a groove formed in a substrate, and its manufacturing method.

In accordance with high integration of a semiconductor integrated circuit, particularly a semiconductor memory device such as a DRAM (dynamic random access memory), etc., a memory cell area tends to be more and more reduced. In order to meet such a tendency, a semiconductor memory device using a memory cell having a trench capacitor structure has been put to practical use. In this type of the semiconductor memory, an opening portion is formed on a semiconductor substrate, and a storage electrode is structured in the opening portion. As a result, an area of the capacitor area, having a storage electrode and its opposite electrode, can be increased.

In the memory cell having the trench capacitor structure of a substrate plate type having a plate electrode, which serves as the opposite electrode of the storage electrode, and which is formed of the semiconductor substrate, the storage electrode is formed at the interior of the opening portion. As a result, the leakage of stored electrical charges between the adjacent memory cells can be reduced, and the distance between the memory cells can be shortened so as to obtain the structure, which is suitable for high integration of the semiconductor memory device.

FIGS. 1, 2A and 2B are an upper surface view of a conventional memory cell having a trench capacitor structure of a substrate plate type, and its cross-sectional view, respectively.

FIG. 2A is a cross-sectional view taken along a line IIA—IIA as indicated by arrows in FIG. 1, and FIG. 2B is a cross-sectional view taken along a line IIB—IIB as indicated by arrows in FIG. 1.

The memory cell shown in these figures comprises one transistor T1 and one capacitor.

The transistor T1 comprises a gate electrode 5 constituting a word line, and source and drain regions 19a and 19b. The gate electrode 5 is formed on e.g., a p-well, which is formed on a surface region of e.g., an N-type semiconductor substrate 2, through a gate insulating film 3. The source and drain regions 19a and 19b are formed in the p-well 1 to be self-aligned with the gate electrode 5. An insulation film 12 is provided on this gate electrode.

The capacitor is formed in the interior of the opening portion 13 formed in the semiconductor substrate 2. A thick insulating film 14 for an element isolation is formed on an inner wall surface of an upper portion of the opening portion 13. The insulating film 14 is used as a mask, and a capacitor insulating film 16 is formed on the entire inner wall of the opening portion 13.

The storage electrode is buried in the interior of the opening portion 13 through the capacitor insulating film 16 and the insulating film 14. The plate elec trode is formed of the semiconductor substrate 2.

In other words, the capacitor comprises the semiconductor substrate 2, the capacitor insulating film 16, which is formed on the inner wall surface of the opening portion 13, and the storage electrode 8, which is buried in the interior of the opening portion 13.

The storage electrode 8 buried in the opening portion 13 is connected to either one source or the drain region 19a of transistor T1 through a connection electrode 10. As shown in FIGS. 2A and 2B, a bit line 28 is formed to be intersected with a word line 5.

The bit line 28 is connected to either the other source or the drain region 19b of the transistor T1 through a connection 29. In the memory cell structure arranged as in FIG. 1, a capacitor 7 is formed at a lower portion of a passing word line 5. The passing word line 5 passes through a certain memory cell, and does not serve as a gate electrode.

In the conventional memory cell having a trench capacitor structure of a substrate plate type, since the storage electrode 8 is formed in the opening portion 13, the area of the capacitor having the storage electrode 8 and the semiconductor substrate 2 can be increased. Moreover, since the storage electrode 8 is coated with the capacitor insulating film 16, and element isolation insulating films 4 and 14, leakage of stored electrical charges can be controlled. Thus, since the memory cell can be fined and the distance between the adjacent memory cells can be shortened, the semiconductor memory device can be highly integrated.

However, since an area of the opening portion 13 is reduced in accordance with the reduction of the area of the memory cell, the depth of the opening portion 13 must be larger to ensure the capacitance of the capacitor. Generally, it is extremely difficult to equally form the opening portion having a large aspect ratio.

To control the increase of the aspect ratio and increase the capacitance of the capacitor, there is a method in which an insulating film having a high dielectric constant such as $Ta_2O_5$ is used as a capacitor insulating film. However, as shown in FIGS. 1, 2A and 2B, in the memory cell structure using the capacitor structure of a trench type, it was difficult to use the high dielectric film as a capacitor insulating film for the following reason:

Specifically, generally, the high dielectric film has a property in which the composition of the film is changed and the dielectric constant is reduced if the heating process of e.g. 750° C. to 800° C. is carried out. For example, in the insulating film containing oxygen such as $Ta_2O_5$, there is possibility that the composition will be changed by the heating process (e.g., separation of oxygen).

Also, there is possibility that the insulating film will react with metal constituting the semiconductor substrate 2 or the storage electrode 8 by the heating process of 750° C. to 800° C.

Moreover, in the conventional memory cell having a trench capacitor structure of a substrate plate type as shown in FIG. 1, 2A and 2B, since the capacitor 7 is formed at the lower portion of the passing word line 5, which is formed of the same layer as the gate electrode. Due to this, it is needed that the gate electrode be formed after forming the capacitor 7 in the opening portion 13 to manufacture the above-structured memory cell.

As a result, by the heating process when the gate insulating film 3 is formed under the gate electrode, there is possibility that the film quality of the high dielectric film will be changed or the high dielectlic film will react with the metal constituting the storage electrode 8. However, in the case of using an oxide film (e.g., $SiO_2$) as a gate insulating film 3, the quality of the gate insulating film 3 intends to be better if the forming temperature is set to be higher. For this reason, the high temperature heating process is required. Thus, there was a contrary requirement.

According to the conventional semiconductor memory device, in the case of using the memory cell having a trench capacitor structure of a substrate plate type in which the capacitor is formed at the lower portion of the passing word line, the gate electrode formed of the same layer as the word line was formed after forming the capacitor.

Moreover, in the case of forming the capacitor insulating film of the high dielectric film, the quality of the high dielectric film was changed by the following heating process. Due to this, it was desirable to carry out the heating process, e.g., processing the gate insulating film after forming the capacitor insulating film.

Therefore, according to the semiconductor memory device having the above-structured memory cell, there was difficulty in using the high dielectric film as a capacitor insulating film.

BRIEF SUMMARY OF THE INVENTION

An object of the present invention is to provide a highly integrated semiconductor memory device having a capacitor structure of a trench type, which can improve the order of a capacitor insulating film forming process and a gate insulating film forming process, and which can use a high dielectric film as a capacitor insulating film without any problem even if a heating process is carried out, and to provide its manufacturing method.

In order to achieve the above object, according to the present invention, there is provided a semiconductor memory device comprising:

a MOS-type transistor formed on a semiconductor substrate;

a capacitor formed in the interior of an opening portion formed in the semiconductor substrate to be adjacent to the MOS-type transistor, the capacitor having a capacitor insulating film formed of a high dielectric film; and a line layer for connecting respective gate electrodes of the MOS-type transistor separated to be island-shaped to prevent from being presented on a region where the opening portion is formed, the line layer formed of a conductive layer different from the gate electrodes in its level.

Moreover, according to the present invention, there is provided a method for manufacturing a semiconductor memory device comprising the steps of:

forming a conductive layer, constituting a gate electrode, on a semiconductor substrate through a gate insulating film;

etching said conductive layer and a part of said semiconductor substrate to form an opening portion;

forming a capacitor having a storage electrode and a plate electrode in said opening portion;

etching said conductive layer to form a gate electrode; and forming a line layer connected to said gate electrode.

According to the above-mentioned semiconductor memory device of the present invention and its manufacturing method, the device comprises the transistor and the capacitor, and the gate electrode of the transistor is formed to be separated to be island-shaped in a region other than the opening portion formed in the semiconductor substrate to form the capacitor. As a result, after the gate insulating film and the gate electrode are formed on the semiconductor substrate, the opening portion is formed in the semiconductor substrate, so that the capacitor can be formed.

Therefore, it is unnecessary to carry out the thermal process such as a formation of the gate insulating film after forming the capacitor insulating film using the high dielectric film. As a result, the quality of the capacitor insulating film can be prevented from being changed.

Thus, the high dielectric film can be used as a capacitor insulating film.

Moreover, the semiconductor memory device of the present invention comprises the line layer for connecting the gate electrode separated to be island-shaped. The line layer is formed of the conductive layer, which is different from the conductive layer of the gate electrode. As a result, the line layer can be formed after forming the capacitor, and the gate electrode can be connected thereto.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is an upper surface view showing the structure of a semiconductor memory device according to a first embodiment of the present invention;

FIG. 4A is a cross-sectional view taken along a line IVA—IVA as indicated by arrows in FIG. 3;

FIG. 4B is a cross-sectional view taken along a line IVB—IVB as indicated by arrows in FIG. 3;

FIG. 5A is a cross-sectional view explaining a manufacturing process corresponding to the cross-sectional view, taken along a line IVA—IVA as indicated by arrows in FIG. 3, of a semiconductor memory device according to a first embodiment of the present invention;

FIG. 5B is a cross-sectional view explaining a manufacturing process corresponding to the cross-sectional view, taken along a line IVB—IVB as indicated by arrows in FIG. 3, of a semiconductor memory device according to the first embodiment of the present invention;

FIG. 6A is a cross-sectional view explaining a manufacturing process following on the process of FIG. 5A;

FIG. 6B is a cross-sectional view explaining a manufacturing process following on the process of FIG. 5B;

FIG. 7A is a cross-sectional view explaining a manufacturing process following on the process of FIG. 6A;

FIG. 7B is a cross-sectional view explaining a manufacturing process following on the process of FIG. 6B;

FIG. 8A is a cross-sectional view explaining a manufacturing process following on the process of FIG. 7A;

FIG. 8B is a cross-sectional view explaining a manufacturing process following on the process of FIG. 7;

FIG. 10A is a cross-sectional view explaining a manufacturing process following on the process of FIG. 9A;

FIG. 10B is a cross-sectional view explaining a manufacturing process following on the process of FIG. 9B;

FIG. 23 is a cross-sectional view explaining a manufacturing process following on the process of FIG. 22;

FIG. 24 is a cross-sectional view explaining a manufacturing process following on the process of FIG. 23;

FIG. 29 is an upper surface view of the semiconductor memory device of the present invention having a memory cell area, which is different from the cases of the first to third embodiments.

FIG. 30 is an upper surface view of the semiconductor memory device of the present invention having the structure in which an opening diameter of an opening portion is reduced as compared with the case of FIG. 29;

FIG. 31 is an upper surface view explaining the case that the semiconductor device forms a flip-flop circuit and that a conductive layer is used as a wire layer according to a fifth embodiment of the present invention;

FIG. 32 is a cross-sectional view taken along a line XXXA—XXXA as indicated by arrows in FIG. 31;

FIG. 33 is a cross-sectional view explaining a manufacturing process following on the process of FIG. 32; and FIG. 34 is a cross-sectional view explaining a manufacturing process following on the process of FIG. 33.

DETAILED DESCRIPTION OF THE INVENTION

Embodiments of the present invention will now be described with reference to the accompanying drawings.

FIG. 3 is an upper surface view showing the structure of a semiconductor memory device according to a first embodiment of the present invention, FIG. 4A is a cross-sectional view taken along a line IVA—IVA as indicated by arrows in FIG. 3, and FIG. 4B is a cross-sectional view taken along a line IVB—IVB as indicated by arrows in FIG. 3.

Figure 1:
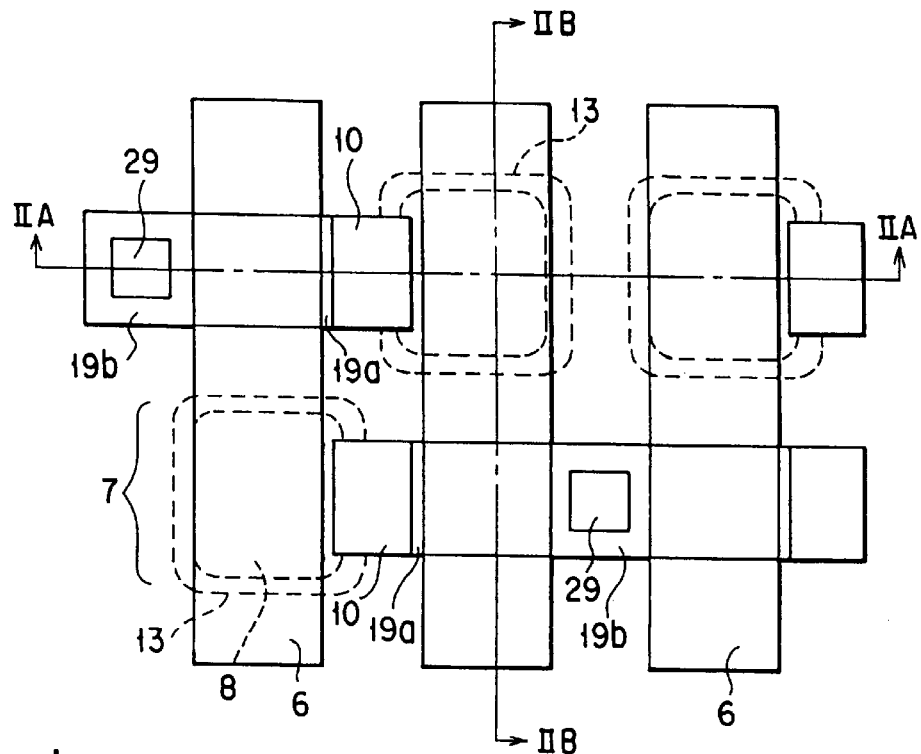
FIG. 1 is an upper surface view showing the structure of a conventional semiconductor memory device.
Figure 2A:
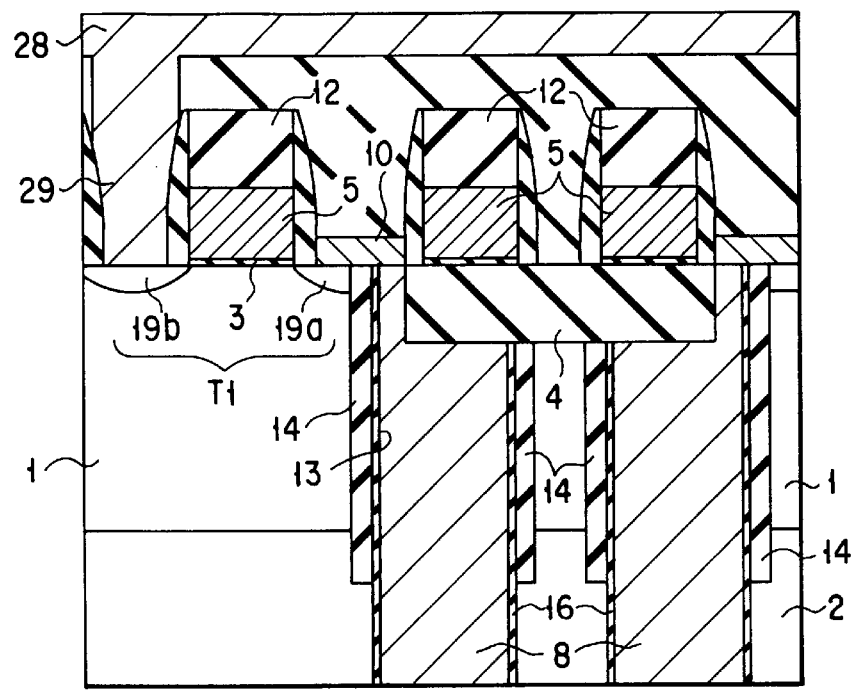
FIG. 2A is a cross-sectional view taken along a line IIA—IIA as indicated by arrows in FIG. 1.
Figure 2B:
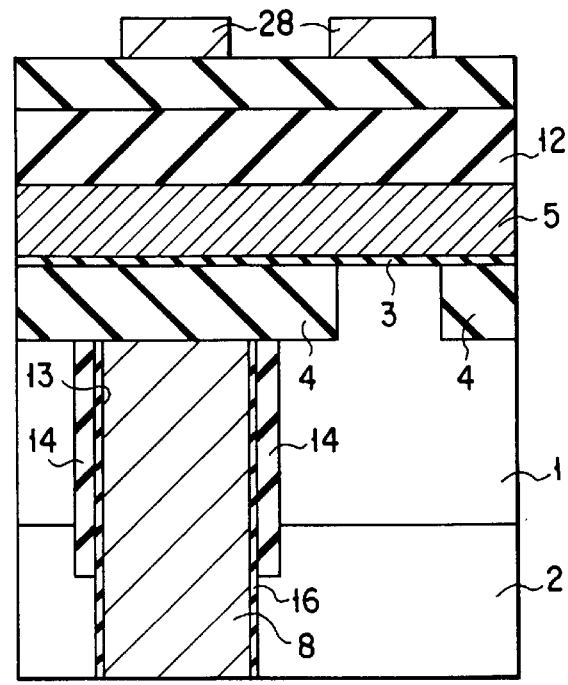
FIG. 2B is a cross-sectional view taken along a line IIB—IIB as indicated by arrows in FIG. 1.

Similar to the conventional device as shown in FIGS. 2A and 2B, the semiconductor of this embodiment comprises a transistor T1 and a capacitor.

As shown in FIG. 4A, the transistor T1 comprises a gate electrode 6 and source and drain regions 19a, 19b. The gate electrode 6 is formed on e.g., a p-well, which is formed on a surface region of e.g., an n-type semiconductor substrate 2, through a gate insulating film 3. The source and drain regions are formed in the p-well 1 to be adjacent to the gate electrode 6.

The capacitor is formed in the interior of an opening portion 13 formed in the semiconductor substrate. A thick insulating film 14 for an element isolation is formed on an inner wall surface of an upper portion of the opening portion 13. The insulating film 14 is used as a mask, and a capacitor insulating film 16 is formed on the inner wall of the opening portion 13.

A storage electrode 8 is buried in the interior of the opening portion 13 through the capacitor insulating film 16 and the insulating film 14. A plate electrode is formed of the semiconductor substrate 2.

In other words, the capacitor comprises the semiconductor substrate 2, the capacitor insulating film 16, which is formed on the inner wall surface of the opening portion 13, and the storage electrode 8, which is buried in the interior of the opening portion 13.

The storage electrode 8 buried in the opening portion 13 is connected to either one source of transistor T1 or the drain region 19a through a connection electrode 10. A bit line 28 (not shown in FIG. 3) is formed to be intersected with a word line 5.

The bit line 28 is connected to either the other source of the transistor T1 or the drain region 19b through a connection 29.

According to the semiconductor memory device of this embodiment, unlike the conventional semiconductor memory device in which the gate electrode and the word line are formed of the same layer, the gate electrode 6 is separately formed to be island-shaped. The gate electrode 6 and the word line 5, which is formed of the layer different from the gate electrode 6, are connected to each other.

In other words, as shown in FIG. 4A, the feature of the passing word line lies in that the word line 5 is formed of the layer, which is different from the gate electrode 6.

According to the above-explained structure, the opening portion 13 can be formed after forming the gate electrode 6. Thereafter, the word line 5 can be formed to be connected to the gate electrode 6.

Next, the following will explain a method for manufacturing the semiconductor memory device of the above-explained first embodiment with reference to FIGS. 5A and 5B to FIGS. 14A and 14B.

FIGS. 5A, 6A, . . . 14A are cross-sectional views each explaining each manufacturing process corresponding to the cross-sectional view, taken along a line IVA—IVA as indicated by arrows in FIG. 3. FIGS. 5B, 6B, . . . 14B are cross-sectional views each explaining each manufacturing process corresponding to the cross-sectional view, taken along a line IVB—IVB as indicated by arrows in FIG. 3.

As shown in FIGS. 5A and 5B, an element separation region 4 is formed in the surface region of the p-well 1, which is formed on the surface region of the semiconductor substrate 2 such as an N type Si. In these figures, there is used the so-called trench element separation technique in which the opening portion is formed on the semiconductor substrate and the insulating film 4 is buried in the opening portion. However, for example, other element separation methods such as a selection oxidizing method may be used.

Next, the gate insulating film 3 such as an oxide film ($SiO_2$) is formed by thermal oxidation, and a conductive film 6 having a thickness of about 100 to 150 nm such as a polycrystalline silicon film, serving as a gate electrode material, is formed on the gate film 3 by CVD. Moreover, an insulating insulating film 12 having a thickness of about 100 to 150 nm such as SiN is formed on the conductive film 6 by CVD.

Next, as shown in FIGS. 6A and 6B, the insulating film 12 is etched by a normal lithography and an normal etching to remove a portion of the insulating film 12 where the capacitor is formed. Then, a portion where the insulating film 12 is not removed by etching and the residual is used as a mask, and the conductive film 6 and the gate insulating film 3 are etched.

Moreover, the residual insulating film 12 is used as a mask to etch the semiconductor substrate, so that the first opening portion 13, which is deeper than the p-well 1, is formed. The depth of the opening portion is set to be about 0.5 to 1.0 $\mu$m. Thereafter, the insulating film 14 is formed on the side wall of the first opening portion 13. The insulating film 14 can be formed by the following process.

Specifically, the insulating film having a thickness of 25 to 50 nm is deposited on the interior of the first opening portion 13 and the insulating film 12 by CVD (Chemical Vapor Deposition), and subjected to anisotropic etching such as RIE (Reactive Ion Etching). As a result, the insulating film 14 formed on the bottom surface of the first opening portion 13 is removed. In this way, the insulating film 14 can be formed on the side wall of the first opening portion 13.

Next, as shown in FIGS. 7A and 7B, the insulating films 12 and 14 are used as a mask to further etch the semiconductor substrate 2, so that the second opening portion 15 is formed. In this case, the total depth of the opening portions 13 and 15 is set to, e.g., 3 to 5 $\mu$m.

Thereafter, n-type impurity materials are diffused onto the inner wall surface of the second opening portion 15 by e.g., a solid phase diffusion or an ion implantation technique, etc. Thereby, a diffusion region whose concentration is higher than the n-type semiconductor substrate can be formed.

Next, the capacitor insulating film 16 such as $Ta_2O_2$ is formed on the inner wall surface of at least the second opening portion 15 to have an effective film thickness of, e.g., 0.8 to 2.5 $\mu$m. Moreover, the first opening portion 13 and the second opening portion 15 are completely buried by the conductive film 8, serving as a storage electrode, such as TiN.

Due to this, the capacitor insulating film 16 is formed on the inner wall surface of each of the first and second opening portions 13 and 15 and the insulating film 12. Moreover, the conductive film 8 is formed to completely bury the first and second opening portions 13 and 15.

At this time, the conductive film 8 is also formed on the insulating film 12. Due to this, the conductive film 8 formed on the insulating film 12 and the capacitor insulating film 16 are removed by etching back or CMP (Chemical Mechanical Polishing). As a result, the capacitor structure as shown in FIGS. 7A and 7B is completed.

Thereafter, as shown in FIGS. 8A and 8B, the conductive film 8 and the part of the capacitor insulating film 16 are removed by e.g., etching back until the surface level of the conductive film 8, which is buried in the opening portion, and that of the semiconductor substrate are substantially conformed to each other.

Moreover, the insulating film 18, such as an oxide film ($SiO_2$), is formed in a spatial portion of the upper portion of the opening portion where the conductive film 8 is removed by etching back, such that the surface of the insulating film 18 and the surfaces of the insulating films 12 and 14 are placed at the same plane.

The above structure can be made by the following method.

Specifically, by use of CVD, the insulating film 18 is deposited on the spatial portion of the upper portion of the opening portion 13 and the insulating film. Thereafter, the insulating film 18 on the insulating layer 12 is removed by, e.g., CMP, thereby obtaining the above-mentioned structure.

Figure 9A:
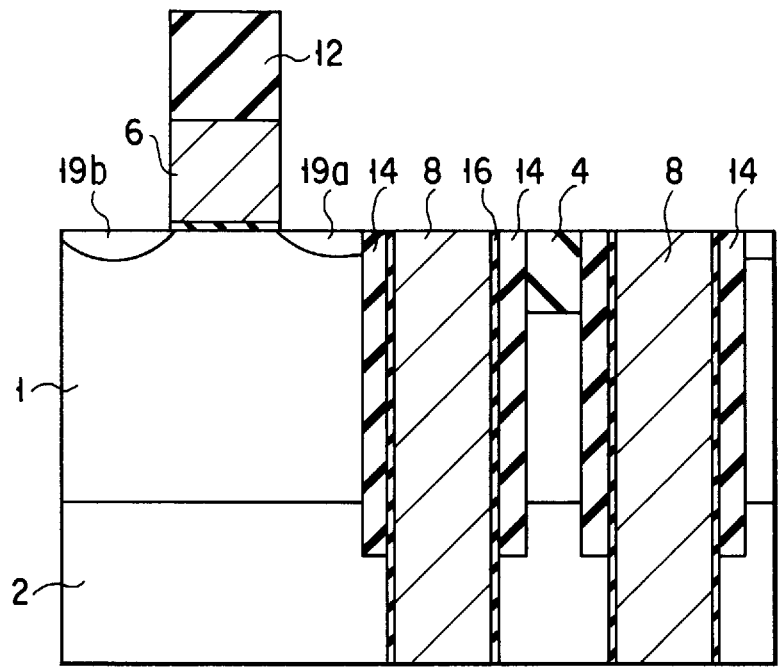
FIG. 9A is a cross-sectional view explaining a manufacturing process following on the process of FIG. 8A.
Figure 9B:
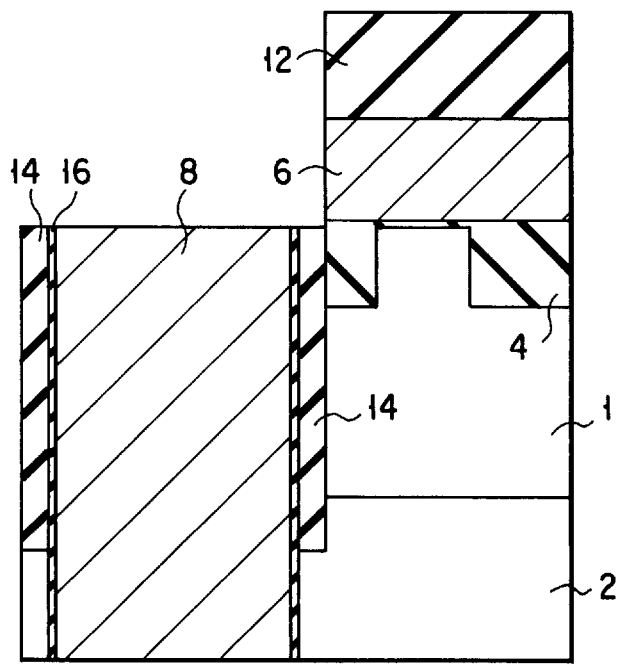
FIG. 9B is a cross-sectional view explaining a manufacturing process following on the process of FIG. 8B.

Next, a resist film having a pattern separated to be island-shaped as shown in FIG. 3 is formed. The resist film is used as a mask, and the insulating layer 12, the conductive layer 6, the insulating film 14, and the insulating film 18 are removed by etching such as RIE. As a result, the gate electrode 6 as shown in FIGS. 9A and 9B is formed. In this case, an etching condition is set such that the etching speed of the conductive film 6 and that of each of the insulating films 12, 14, and 18 are equal to each other. Thereby, the conductive film 6, and the insulating films 12, 14, and 16 can be etched at the same time.

Also, the resist film is used as a mask, and the insulating film 12 and the conductive film 6 are etched. Thereafter, the resist film is removed, and the insulating films 14 and 18 can be removed. In this case, the etching condition must be set such that etching speed of the insulating film 12 and the conductive film 6 must be sufficiently slower than that of each of the insulating films 14 and 18.

Moreover, a resist film having a belt-like pattern as shown in FIG. 3, the resist film 5 is used as a mask, and the insulating film 12 and the conductive film 6 are etched. Thereafter, the insulating films 14 and 18 can be removed.

At the time of thus processing the gate electrode, there is a problem in which resolution is deteriorated if there is a large level difference on the surface in the general lithography. However, in this embodiment, the insulating film 18 is buried in the spatial portion of the upper portion of the opening portion 13, so that the same plane is formed by the surface of the buried insulting film 18 and the surfaces of the insulating films 12 and 14. As a result, the fine pattern can be formed by the general lithography.

After thus processing the gate electrode 6, for example, n-type impurity material is implanted to the surface of the p-well 1 by an ion implantation, so as to form an n-type source and drain diffusion layers 19a and 19b.

Next, as shown in FIGS. 10A and 10B, a side wall insulating film 20 is formed on the gate electrode 6, and the side wall of the insulating film 12 on the side wall of the gate. The side wall insulating film 20 can be formed as follows:

Specifically, for example, an insulating film of, e.g., a silicon nitride film is formed on the side wall of the gate electrode 6, the side wall of the insulating film 12, the surface of the insulating 12, and the semiconductor substrate by e.g., CVD. Then, such formed insulating film is etched by anisotropic etching such as RIE, thereby the side wall insulating film 20 can be formed.

Thereafter, an interlayer insulating film 21 is formed to completely fill the space between the island-shaped gate electrode 6 and the insulating film 12. Then, the interlayer insulating film 21 is removed by, e.g., CMP till the insulating film 12 on the gate electrode is exposed. Thereby, the space therebetween can be buried with the interlayer insulating film 21 to be flattened.

Moreover, the interlayer insulating film 21 is removed to have an opening portion by the general lithography and the etching technique such that the part of the n-type diffusion layer 19a and the part of the storage electrode 8 buried in the opening portion 13 are exposed.

At this time, the etching speed of each of the insulating films 12 and 20 is set to be sufficiently slower than that of the interlayer insulating film 21. As a result, the opening portion can be formed to be self-aligned with the gate electrode 6.

Thereafter, the conductive film 10 such as W is formed in the interior of the opening portion and on the insulating films 12 and 21 by e.g., CVD such that the insulating films 12 and 21 are exposed by e.g., etching back or CMP. Thereby, the connection electrode 10 for connecting the diffusion layer 19a to the storage electrode 8 is formed.

Figure 11A:
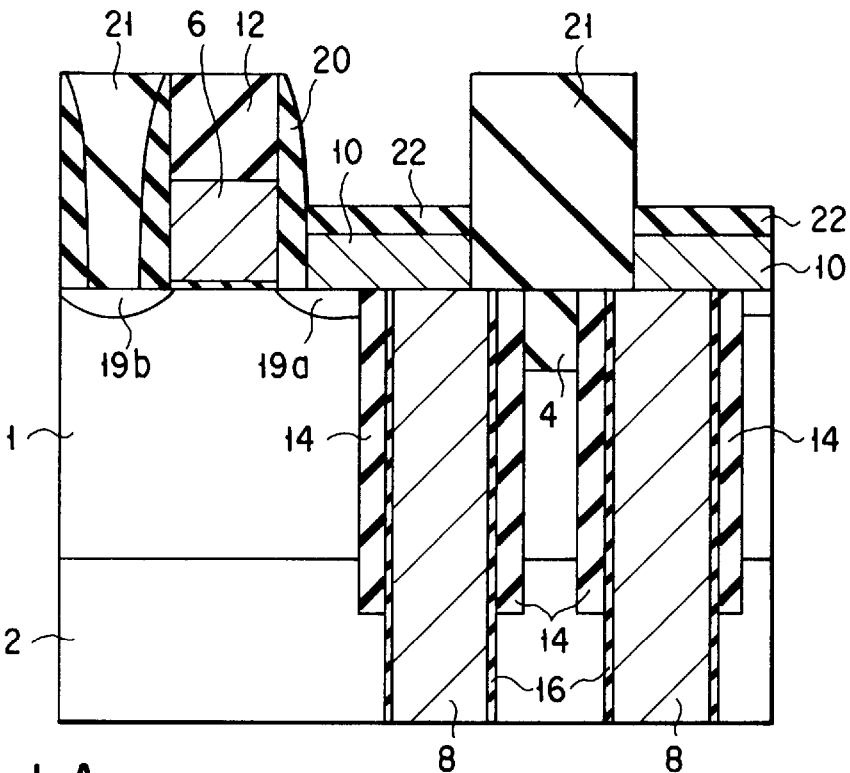
FIG. 11A is a cross-sectional view explaining a manufacturing process following on the process of FIG. 10A.
Figure 11B:
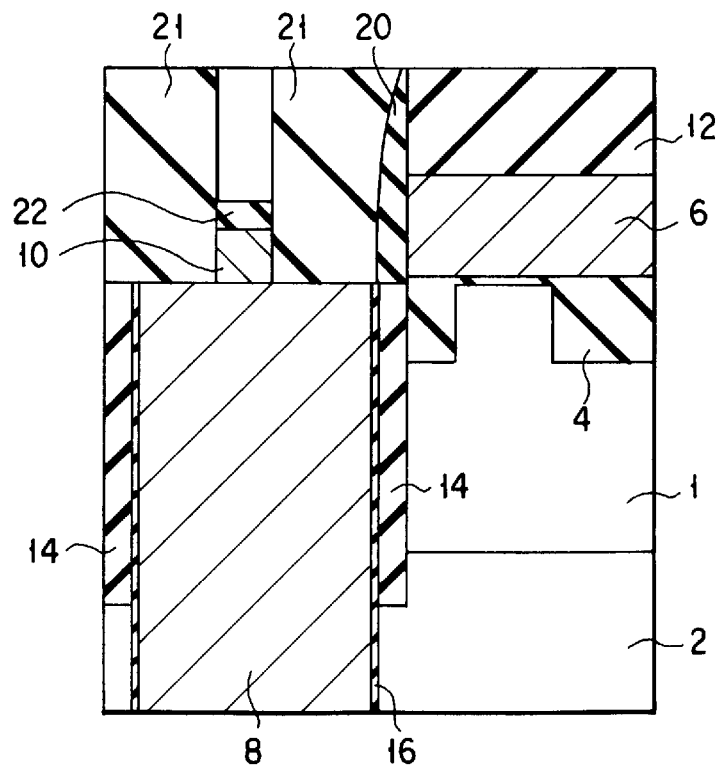
FIG. 11B is a cross-sectional view explaining a manufacturing process following on the process of FIG. 10B.

Thereafter, as shown in FIGS. 11A and 11B, the surface of the connection electrode 10 is retracted by e.g., etching back such that the level of the surface of the connection electrode 10 is lower than that of the surface of the gate electrode 6. At this time, the thickness of the connection electrode 10 is set to be about 25 to 50 $\mu$m. Moreover, an insulating film 22 such as a silicon nitride film is formed by e.g., CVD to completely fill the spatial region of the upper portion of the opening portion formed by etching back the connection electrode 10. Thereafter, the surface of the insulating film 22 is retracted by e.g., etching back.

Figure 12A:
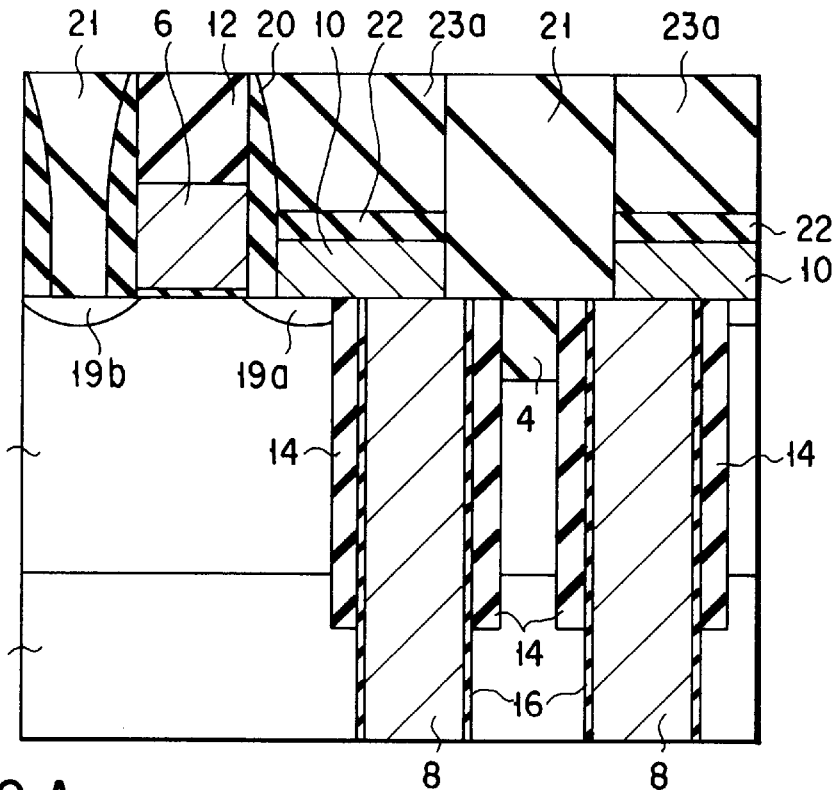
FIG. 12A is a cross-sectional view explaining a manufacturing process following on the process of FIG. 11A.
Figure 12B:
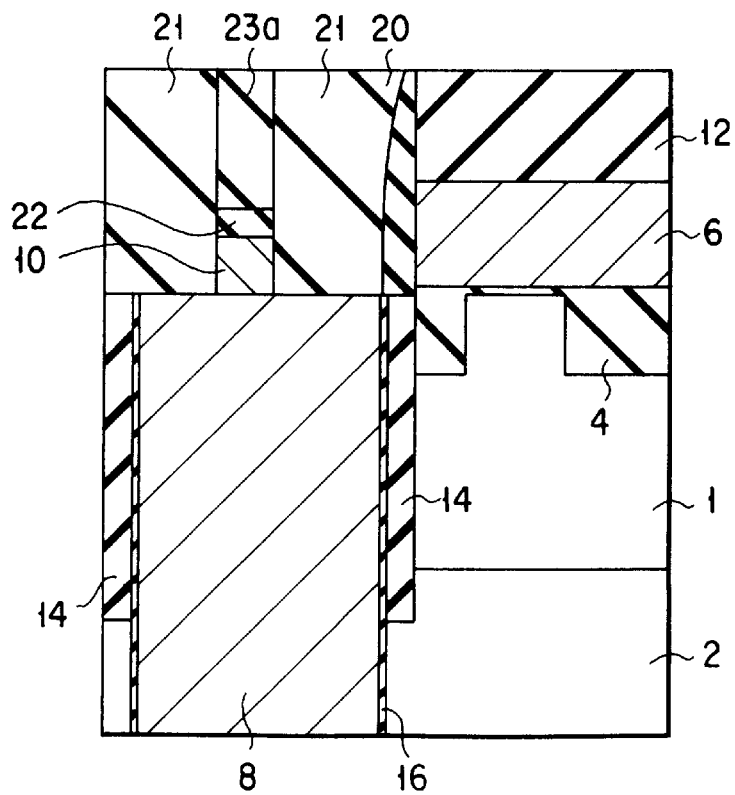
FIG. 12B is a cross-sectional view explaining a manufacturing process following on the process of FIG. 11B.

Next, an interlayer insulating film 23 is formed to completely fill the spatial region formed on the connection electrode 10. Thereafter, as shown in FIGS. 12A and 12B, the interlayer insulating films 21 and 23a are removed by e.g., CMP till the insulating film 12 is exposed. Thereby, the surfaces of the interlayer insulating films 21 and 23a can be flattened.

Figure 13A:
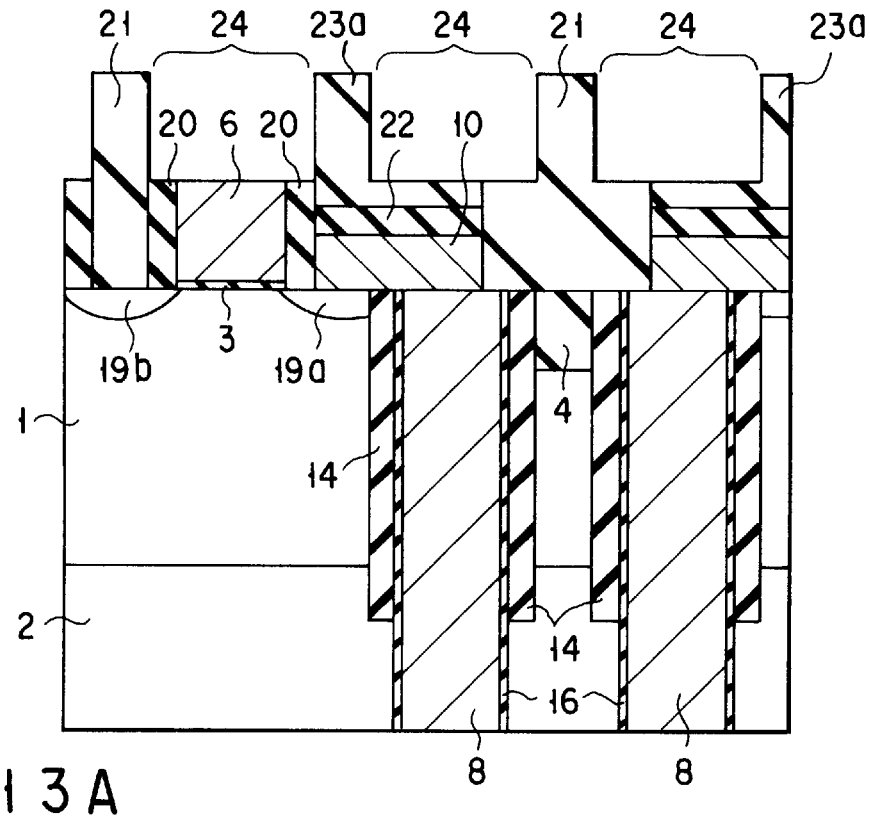
FIG. 13A is a cross-sectional view explaining a manufacturing process following on the process of FIG. 12A.
Figure 13B:
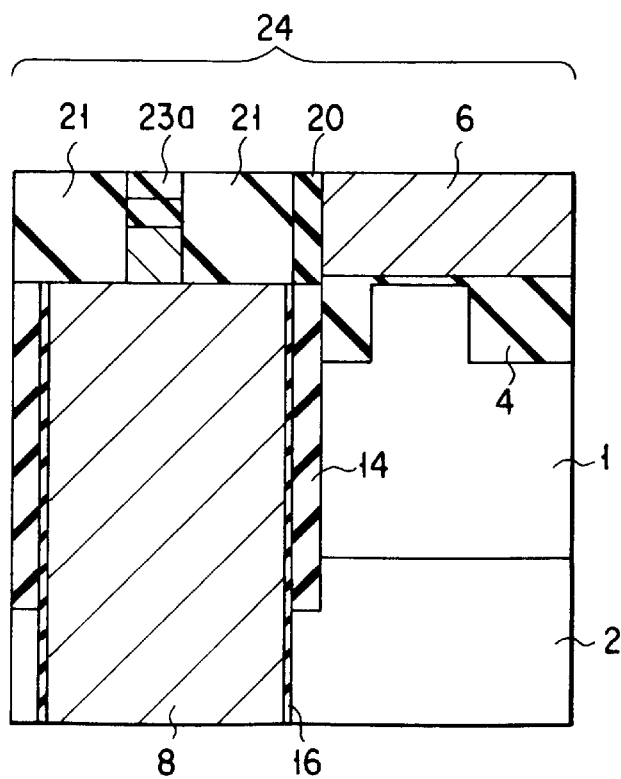
FIG. 13B is a cross-sectional view explaining a manufacturing process following on the process of FIG. 12B.

Moreover, as shown in FIGS. 13A and 13B, the interlayer insulating film 21 and the part of the interlayer insulating film 23a are removed by the general lithography and the etching technique to expose the surface of the gate electrode 6. Thereby, a groove 24 having a depth of about 50 to 100 nm can be formed. At this time, the groove 24 is formed by the belt-like pattern, which is shown as word line 5 in FIG. 3.

Figure 14A:
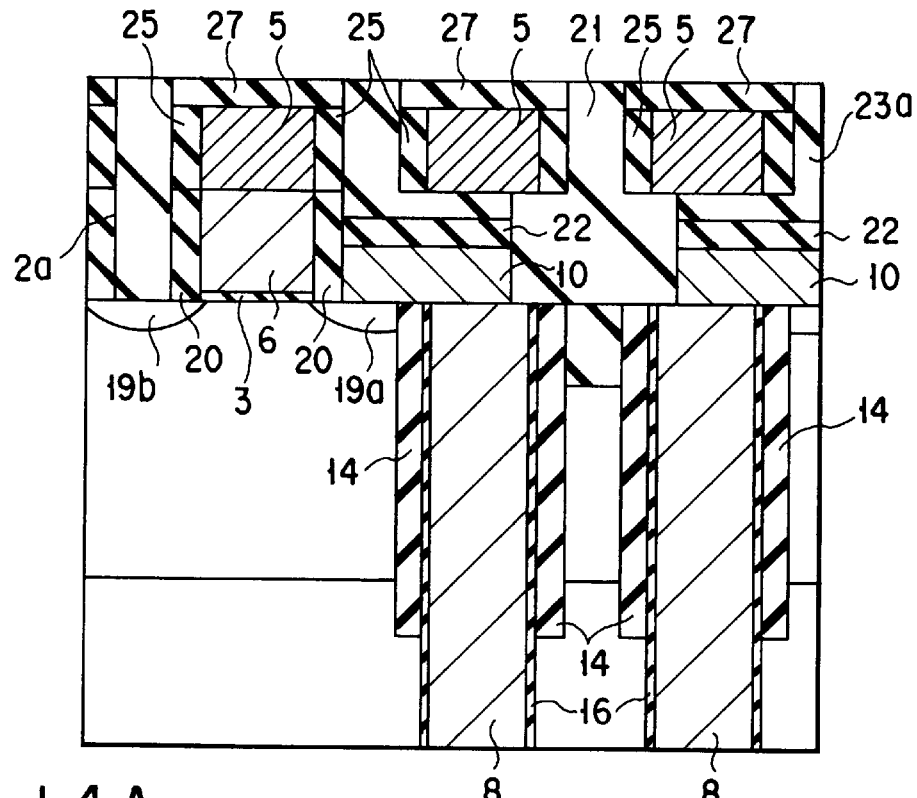
FIG. 14A is a cross-sectional view explaining a manufacturing process following on the process of FIG. 13A.
Figure 14B:
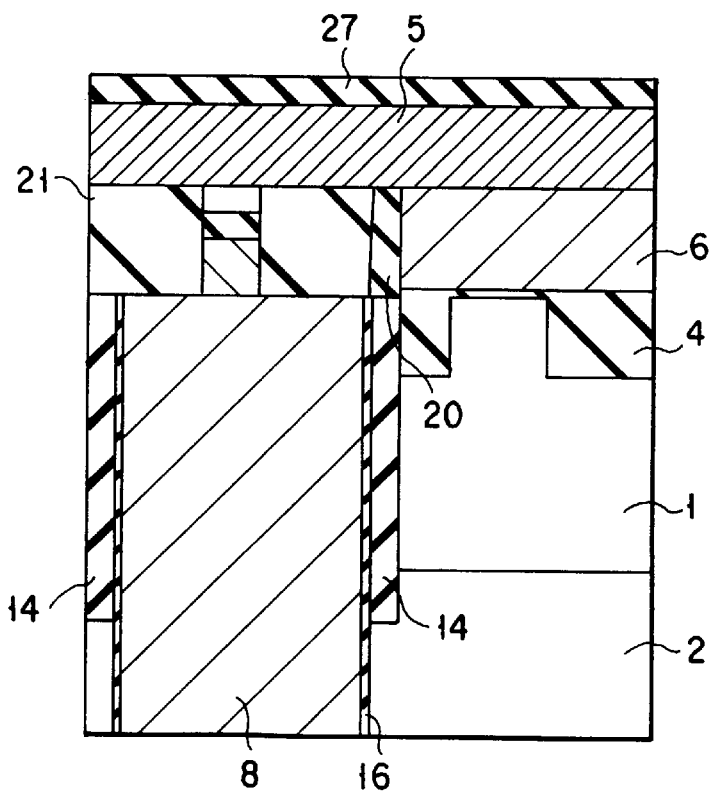
FIG. 14B is a cross-sectional view explaining a manufacturing process following on the process of FIG. 13B.

Next, as shown in FIGS. 14A and 14B, a side wall insulating film, which is formed of an SiN film, is formed on the side wall of the groove 24 to have a thickness of about 25 to 100 nm.

Moreover, the conductive film 5 of, e.g., W is buried in the groove 24 to completely fill the interior of the groove 24 where the insulating film 25 is formed on its side wall. Thereby, the conductive film 5 and the gate electrode 6 are connected to each other. At this time, the conductive film 5 and the surface of the side wall insulating film 25 are retracted by e.g., etching back such that the surfaces of the conductive film 5 and the side wall insulating film 25 are lower than the surface of the interlayer insulating film 23. Moreover, an insulating film 27 is buried in the spatial portion of the upper portion of the groove 24 formed by the retraction, so that the word line 5 is completed. In this case, for example, though this is not shown in the figure, there is possibility that the word line 5 will be directly connected to the diffusion layer. Due to this, a barrier metal of e.g., TiN can be formed before forming the word line 5 in order to prevent the metal such as W for constituting the word line 5 from being diffused to the diffusion layer.

Thereafter, though this is not shown in the figure, an interlayer insulating film 23b shown in FIG. 4 is formed on an interlayer 23a and the insulating film 27. Moreover, the interlayer insulating films 23b and 23a are etched by the general lithography and the etching technique till the diffusion layer 19b is exposed. As a result, a connection hole 2a is formed. At this time, the etching speed of each of the interlayer insulating films 23b and 23a is set to be sufficiently faster than that of each of the insulating films 27, 25, 20. As a result, the connection hole 29 can be formed to be self-aligned with the gate electrode 6.

Next, similar to the process of forming the word line 5, the belt-like groove having a depth of about 50 to 100 nm is formed in the interlayer insulating film 23b to be intersected with the word line 5. Then, the conductive film such as W is buried in the groove, so that the bit line 28 is formed. In this case, the barrier metal, of e.g., TiN can be formed before forming the bit line 28.

In this way, the semiconductor memory device as shown in FIG. 4 can be completed.

According to this embodiment, the gate electrode 6 and the word line 5 are formed of a different conductive layer and the gate electrode 6 is formed. Thereafter, the opening portion 15 and the capacitor formed in the opening portion 15 are formed. Moreover, thereafter, the word line is formed.

As a result, the gate insulating film 3 can be formed before forming the capacitor insulating film 16. Therefore, even in a case that the high dielectric film is used as capacitor insulating film 16, it is possible to prevent the characteristic of the capacitor insulating film 16 from being deteriorated by the heating process in forming the gate insulating film 3.

Moreover, the gate electrode 6 and the word line 5 are formed of a different conductive layer and the opening portions 13 and 15 are formed. Thereafter, the word line 5 is formed. As a result, the word line 5 can be formed to be passed the upper portion of the opening portion 13.

Furthermore, after forming the connection electrode 10 for connecting the source of the transistor or the drain diffusion layer 19a to the storage electrode 8, the word line 5 is formed. As a result, the word line 5 can be formed to be passed the upper portion of the connection electrode 10.

In the conventional case, the gate electrode 6 and the word line 5 are formed of the same conductive layer. After forming the gate electrode 6 and the word line 5, the diffusion layer 19a was formed to be self-aligned with the gate electrode.

Due to this, the connection electrode 10 to be connected to the diffusion layer 19a must be formed in the extremely small area between the gate electrode 6 and the passing word line 5 as shown in FIGS. 2A and 3B. Particularly, since the distance between the word lines 5 was shortened by highly integration of the semiconductor memory device, the contact area between the connection electrode 10 and the storage electrode 8 was reduced, and the connection resistance was increased.

In contrast, according to the present invention, the gate electrode 6 and the word line 5 are formed of the different conductive layer. Due to this, after forming the gate electrode 6, the diffusion layer 19a is formed to be self-aligned with the gate electrode 6. Then, after the connection electrode 10 is formed to be connected to the diffusion layer 19a, the word line 5 can be formed.

As a result, as shown in FIGS. 4A and 4B, the word line 5 can be formed at the upper portion of the connection electrode 10, and the contact area between the connection electrode 10 and the storage electrode 8 can be ensured. Thus, according to this embodiment, the connection resistance between the diffusion layer 19a and the storage electrode 8 can be reduced.

Moreover, according to the manufacturing method of this embodiment, the groove 24 is formed such that the surface of the gate electrode 6 is exposed onto the interlayer insulating film 23a. Then, the conductive film is buried in the groove 24 so as to form the word line 5 to be connected to the gate electrode 6. After forming the word line 5, the interlayer insulating film 23 and the surface of the insulating film 27 are completely flattened.

Moreover, in this embodiment, the gate electrode 6 and the word line 5 are not connected through the connection hole. They are directly connected to each other. As a result, the level difference, which is caused by forming the gate electrode 6 and the word line 5 of the different conductive layer, can be prevented from being increased.

Next, the following will explain the method for manufacturing the semiconductor memory device according to the second embodiment of the present invention. Specifically, the method for forming the connection electrode 10 to be self-aligned with the gate electrode 6 will be described with reference to FIG. 15 and FIGS. 16A and 16B to FIGS. 18A and 18B.

Figure 15:
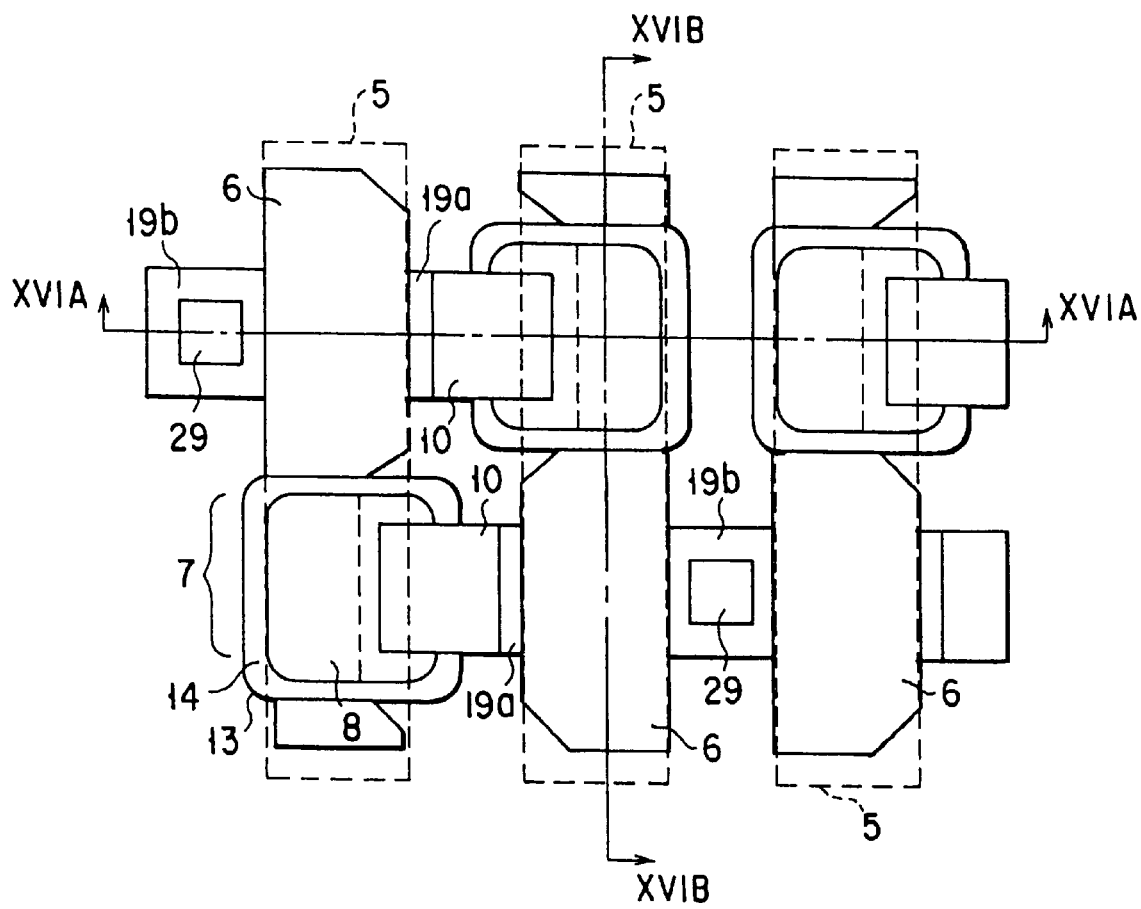
FIG. 15 is an upper surface view showing the structure of a semiconductor memory device according to a second embodiment of the present invention.

FIG. 15 is an upper surface view showing the semiconductor memory device according to this embodiment. FIGS. 16A and 16B to FIGS. 18A and 18B are cross-sectional views each explaining a manufacturing process according to this embodiment.

Figure 16A:
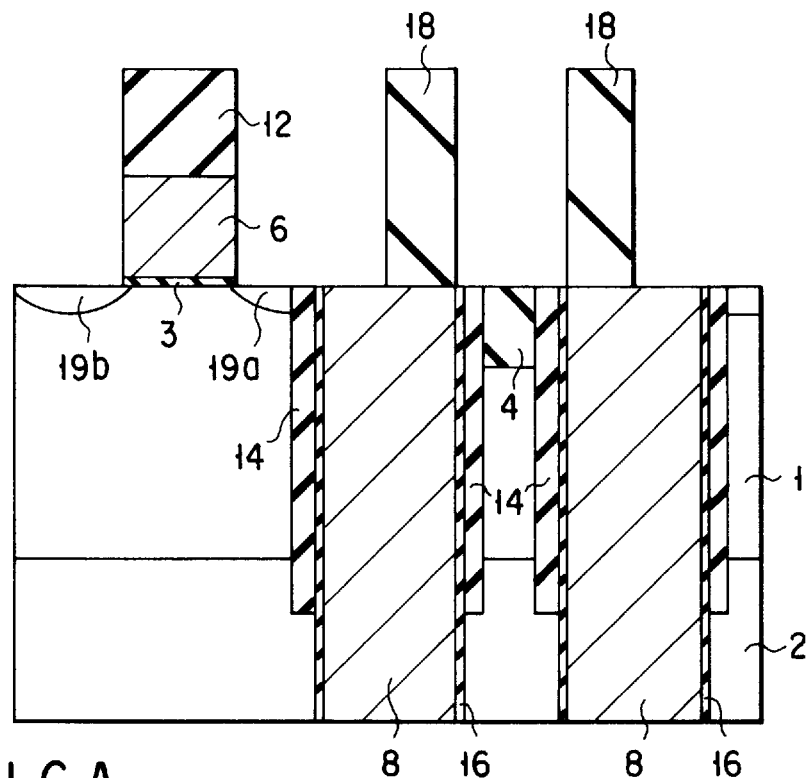
FIG. 16A is a cross-sectional view explaining a manufacturing process corresponding to the cross-sectional view, taken along a line XVIA—XVIA as indicated by arrows in FIG. 15, of a semiconductor memory device according to the second embodiment of the present invention.
Figure 16B:
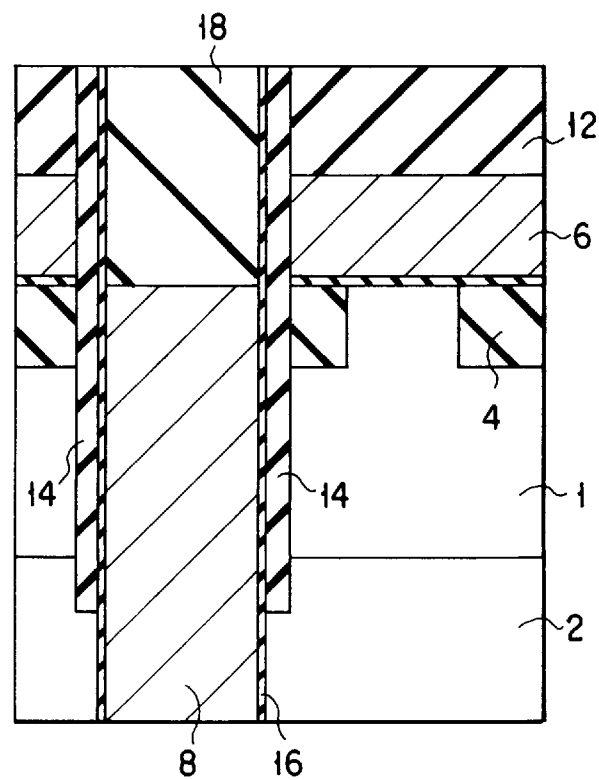
FIG. 16B is a cross-sectional view explaining a manufacturing process corresponding to the cross-sectional view, taken along a line XVIB—XVIB as indicated by arrows in FIG. 15, of a semiconductor memory device according to the second embodiment of the present invention.
Figure 17A:
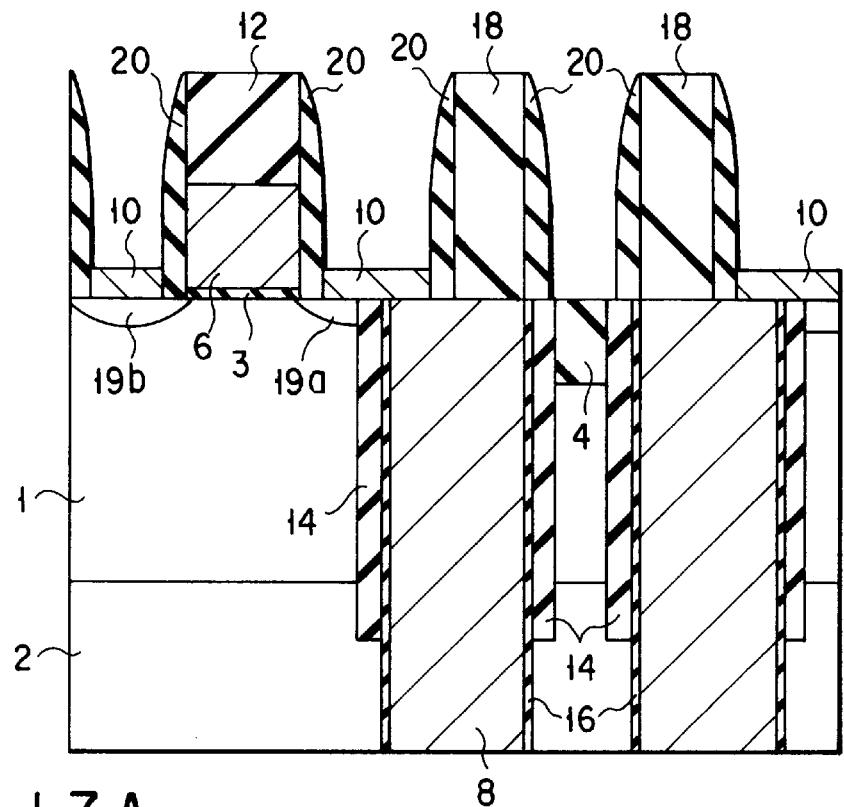
FIG. 17A is a cross-sectional view explaining a manufacturing process following on the process of FIG. 16A.
Figure 17B:
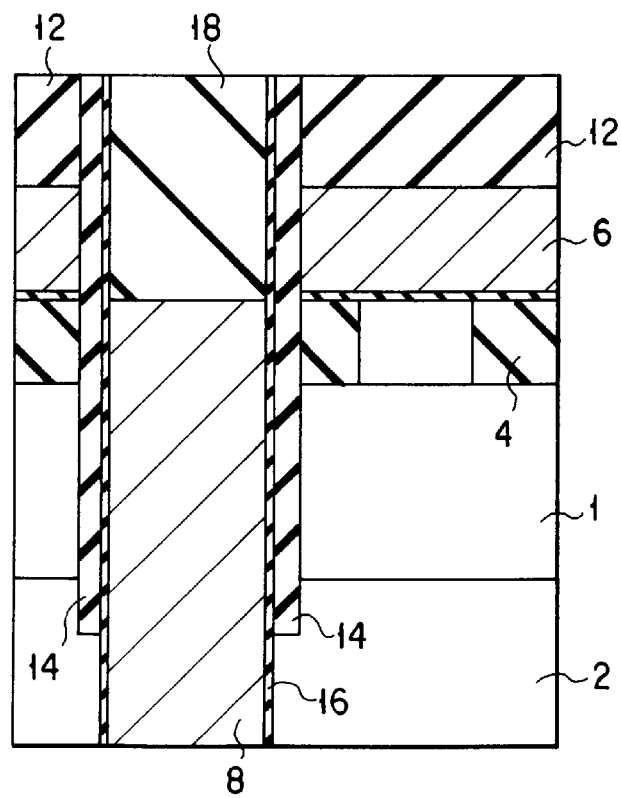
FIG. 17B is a cross-sectional view explaining a manufacturing process following on the process of FIG. 16B.
Figure 18A:
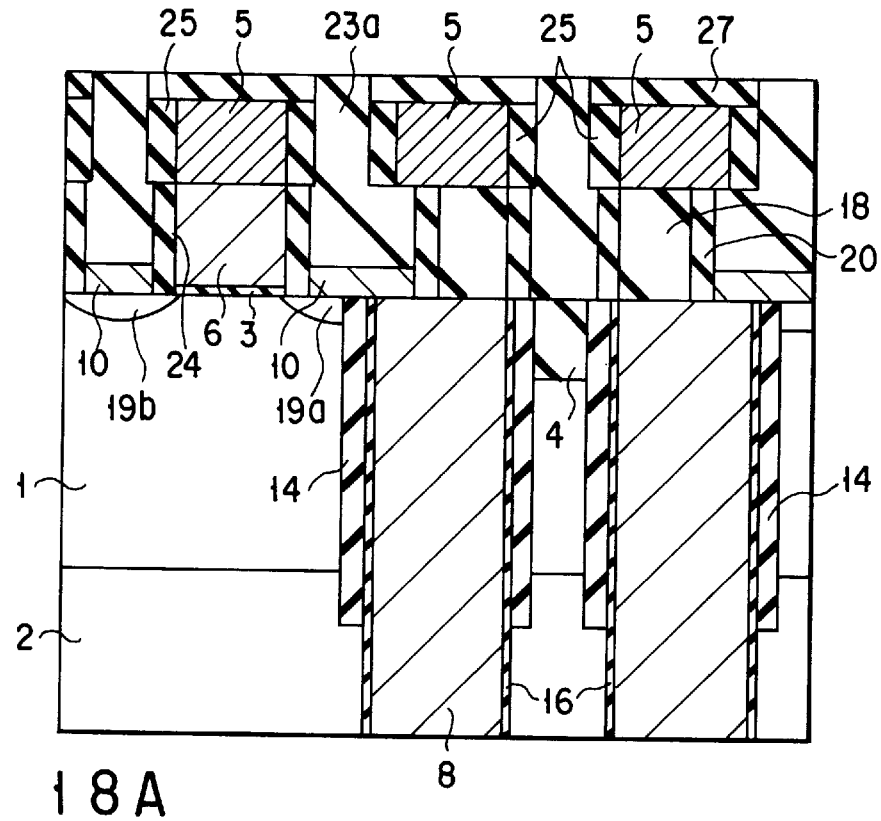
FIG. 18A is a cross-sectional view explaining a manufacturing process following on the process of FIG. 17A.
Figure 18B:
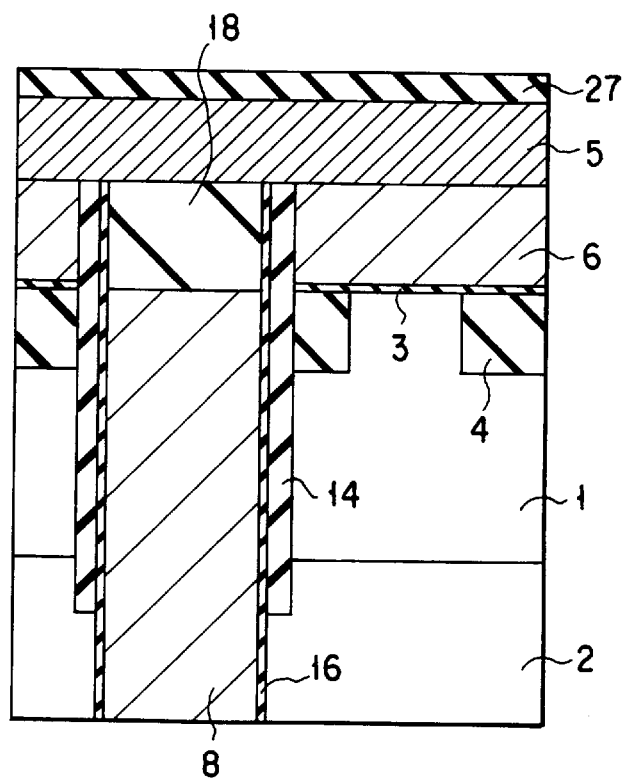
FIG. 18B is a cross-sectional view explaining a manufacturing process following on the process of FIG. 17B.

More specifically, FIGS. 16A, 17A, and 18A are cross-sectional views each explaining a manufacturing process corresponding to the cross-sectional view, taken along a line XVIA—XVIA as indicated by arrows in FIG. 15. FIGS. 16B, 17B, and 18B are cross-sectional views each explaining a manufacturing process corresponding to the cross-sectional view, taken along a line XVIB—XVIB as indicated by arrows in FIG. 15.

The same process as explained the first embodiment are carried out till the structure as shown in FIGS. 8A and 8B is obtained.

Thereafter, unlike the first embodiment in which the insulating films 14 and 18 on the semiconductor substrate are all removed when forming the gate electrode 6, the insulating layers 14 and 18 remain as shown in FIGS. 16A and 16B. The insulating films 14 and 18 fill the space between the gate electrodes 6, which are separated to be island-shaped, in a belt-like manner.

Due to this, the resist film having a belt-like pattern as shown in FIG. 15 is formed. Then, the resist film is used as a mask, and the insulating film 12, the conductive film 6, the insulating film 14, the insulating film 18, and the capacitor insulating film 16 are etched.

At this time, similar to the first embodiment, these etched films are set to have the same etching speed. Then, these etched films can be etched at the same time. Also, these etched films can be individually etched.

Next, as shown in FIGS. 17A and 17B, similar to the first embodiment, the side wall insulating film 20 is formed on the processed gate electrode 6, the insulating film 12, and the wide wall of the insulating film 18. Then, the diffusion layers 19a and 19b and the surface of the storage electrode 8 are exposed. Thereafter, the conductive film such as W is selectively formed on the exposed diffusion layers 19a, 19b, and the surface of the storage electrode 8 by the film forming technique such as a selective CVD. As a result, the connection electrode 10 is formed.

Thereafter, similar to the first embodiment, the interlayer insulating film 23a is formed to fill the space among the gate electrode 6, the insulating film 12, and the insulating film 18 as shown in FIGS. 18A and 18B. Then, the groove 24 is formed in the interlayer insulating film 23a, and the conductive film is buried in the groove 24 so as to form the gate electrode 6.

Moreover, similar to the first embodiment, the bit line is formed, and the semiconductor memory device is completed.

Thus, in this embodiment, the pattern of the resist film, which is used in processing the gate electrode 6, is formed to be not island-shaped but belt-shaped. Then, the gate electrode 6, which is processed by the resist film, and the insulating film 18 are used as a mask, and the connection electrode 10 can be selectively formed on the exposed diffusion layers 19a, 19b, and the storage electrode 8. As a result, unlike the first embodiment, since it is unnecessary to process the interlayer insulating film 21 by lithography, the manufacturing process can be simplified.

Moreover, the storage electrode 8 and the gate electrode 6 of the memory cell adjacent in the direction of the word line of the storage electrode 8 can be prevented from being shortened.

The following will explain the third embodiment of the present invention with reference to FIGS. 19A and 19B, and FIG. 20 to FIG. 26.

Figure 19A:
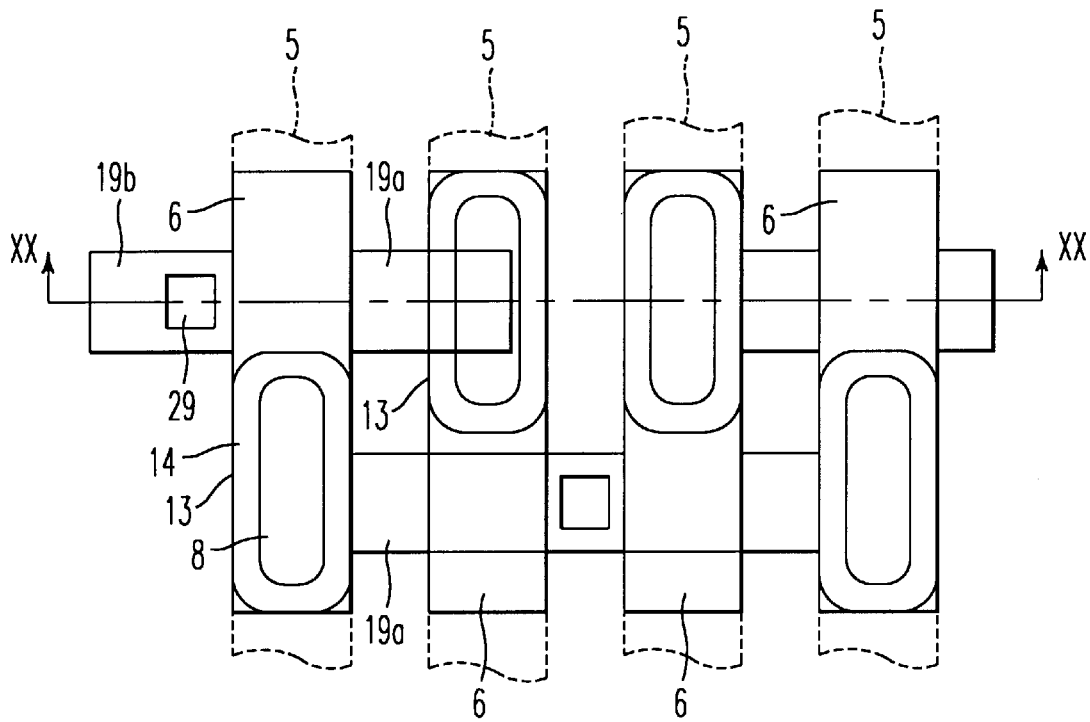
FIG. 19A is an upper surface view showing the structure of a semiconductor memory device according to a third embodiment of the present invention.
Figure 19B:
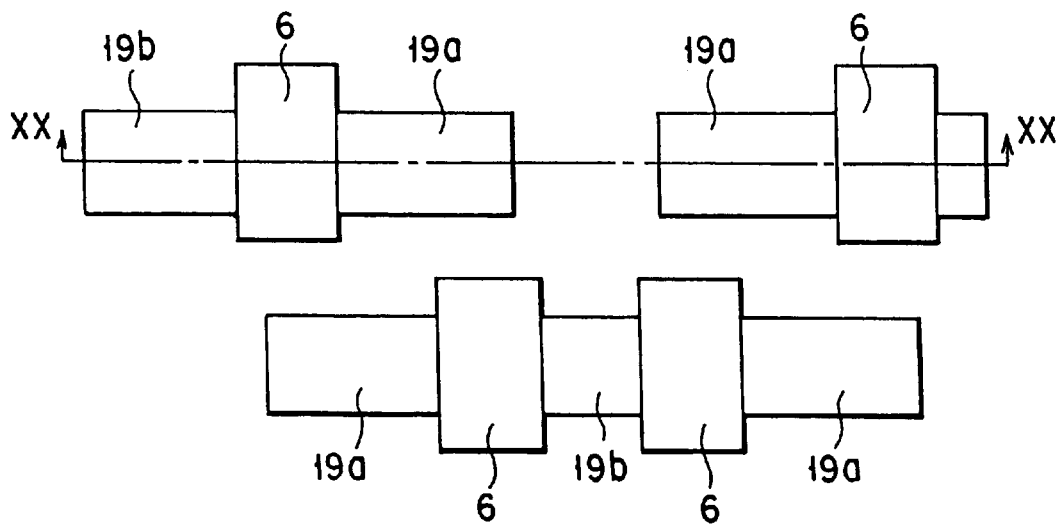
FIG. 19B is an upper surface view showing the mid-course of the manufacturing process of the semiconductor memory device according to the third embodiment of the present invention.

FIG. 19A is an upper surface view of the semiconductor memory device of this embodiment. FIG. 19B is an upper surface view showing the mid-course of the manufacturing process of the semiconductor memory device according to this embodiment. FIGS. 20 to 26 are cross-sectional views each explaining a manufacturing process corresponding to the cross-sectional view, taken along a line XXA—XXA as indicated by arrows in FIG. 19A.

In the first and second embodiments, the source of the transistor or the drain diffusion 19a, and the storage electrode 8 were connected by use of the connection electrode 10. However, in this embodiment, the diffusion layer 19a and the storage electrode 8 can be connected by use of a diffusion layer 19c, which is formed on the side wall surface of the upper portion of the opening portion 13, in place of the connection electrode 10.

Figure 20:
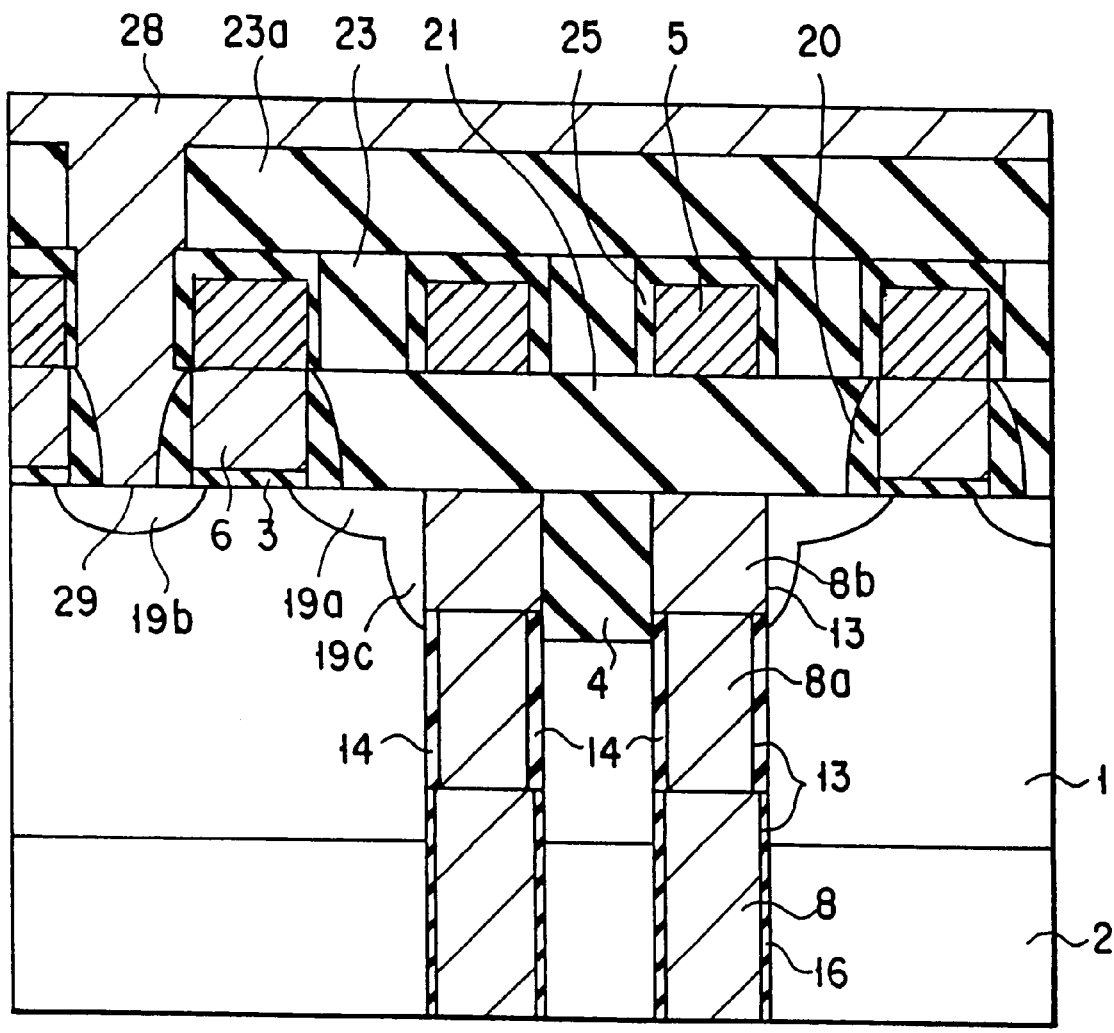
FIG. 20 is a cross-sectional view taken along a line XXA—XXA as indicated by arrows in FIG. 19A.

As shown in FIGS. 19A and 20, in the third embodiment, similar to the first and second embodiment, the gate electrode 6 and the word line 5 are formed of a different conductive layer. Then, the gate electrodes 6 of the respective memory cells are connected by the word line 5.

In the region where the opening portion 13 is formed, the conductive layer, which constitutes the gate electrode 6, is removed. Then, the word line 5, which is different from the gate electrode 6, passes the upper portion of the opening portion 13.

In this embodiment, unlike the first and second embodiments, the storage electrode 8 is formed of a metal film such as TiN, which is buried in mid of the opening portion 13. Then, the conductive films 8a and 8b such as polycrystalline silicon films are buried in the opening portion 13 through the insulating film 14.

Also, the part of the side wall insulating film 14 is removed from the upper portion of the opening portion 13. Then, the conductive film 8b and the diffusion layer 19c are contacted each other at the side wall surface of the exposed opening portion 13. Thus, the source of the transistor or the drain diffusion layer 19a and the storage electrode 8 are connected to each other through the diffusion layer 19c and the conductive film 8b. In this case, the diffusion layer 19c is formed on the side wall surface of the opening portion, and the conductive film 8b is buried in the upper region of the opening portion 13.

The diffusion layer 19c can be formed by diffusing n-type impurity material, which is added to the conductive film 8a or 8b, into the p-well 1 from the side wall surface of the opening portion 13.

Next, the following will explain the method of manufacturing the above-structured semiconductor memory device with reference to FIGS. 19 to 26.

First, similar to the first and second embodiments, the gate insulating film 3 and the conductive layer 6, serving as a gate electrode, and the insulating film 12 are formed on the p-well 1 formed on the semiconductor substrate. Thereafter, by the general lithography and the etching technique, the opening portion 13 is formed.

In the first embodiment, the first opening portion 13 and the second opening portion 15 are formed by two times of etching to have the total depth of about 3 to 5 μm. However, in the third embodiment, the opening 13 can be formed to have a predetermined depth of about 3 to 5 μm by one etching.

Figure 21:
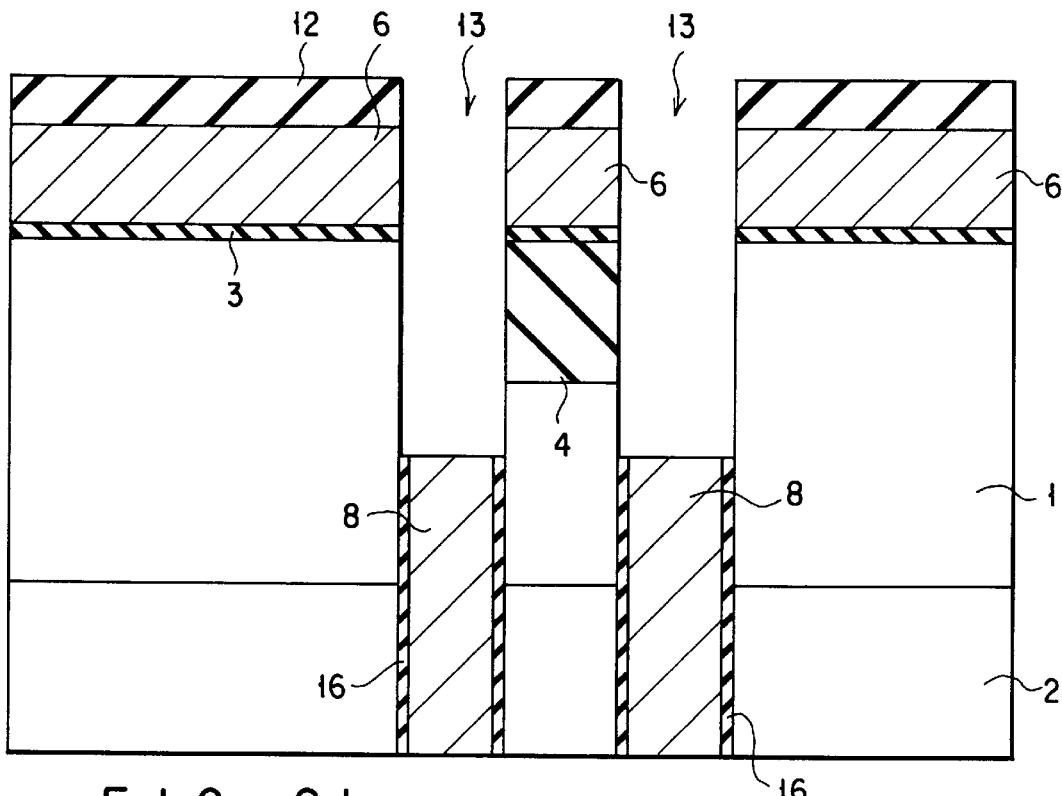
FIG. 21 is a cross-sectional view explaining a manufacturing process corresponding to the cross-sectional view, taken along a line XXA—XXA as indicated by arrows in FIG. 19A.

Next, as shown in FIG. 21, the capacitor insulating film 16 of such as $Ta_2O_5$ is formed on the inner wall surface of the opening portion 13. Then, the conductive film 8 of such as TiN, serving as a storage electrode, is formed in the interior of the opening portion 13 and on the insulating film 12 in order to completely fill the interior of the opening portion 13. Moreover, the conductive film 8 of the upper region of the opening portion 13 is removed by, e.g., etching back, and the capacitor insulating film 16 of this region is removed.

Figure 22:
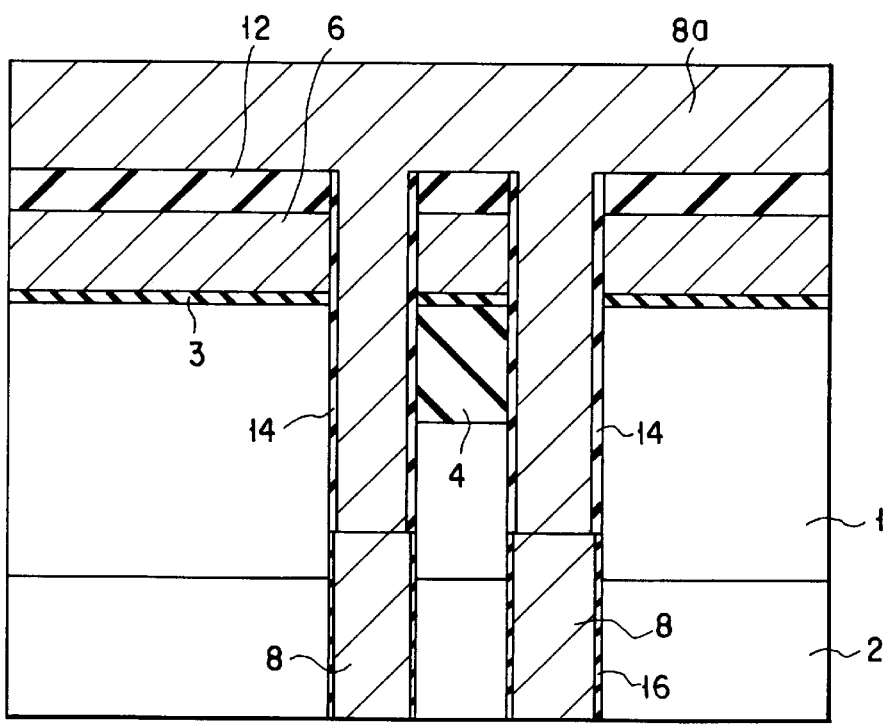
FIG. 22 is a cross-sectional view explaining a manufacturing process following on the process of FIG. 21.

Thereafter, as shown in FIG. 22, the insulating film 14 of e.g., an oxide film ($SiO_2$) is formed on the side wall surface of the upper potion of the opening portion 13, the surface of the storage node of the interior of the opening portion 13, and the insulating film 12 by e.g., CVD.

Next, the insulating film 14 formed on the surface of the storage electrode is removed by anisotropic etching such as RIE. As a result, the insulating film 14 remains on the side wall surface of the upper portion of the opening 13. Then, to form the electrode for connecting the storage electrode 8 to the source of the transistor or the drain region, the conductive film 8a, serving as a first polycrystalline silicon film, is formed to completely fill the interior of the opening portion 13. In this case, n-type impurity material such as arsenic is added to the first polycrystalline silicon film 8a by e.g., ion-implantation.

Next, as shown in FIG. 23, the part of the conductive film 8a is removed by e.g., etching back, so that the part of the side wall insulating film 14 of the upper portion of the opening portion 13 is exposed. Moreover, the exposed portion of the side wall insulating film 14 is removed, so that the side wall surface of the opening portion 13 is exposed.

Thereafter, as shown in FIG. 24, the conductive film 8b, serving as a second polycrystalline silicon film, is formed to completely fill the upper portion of the opening portion 13 whose side wall surface is exposed.

Figure 25:
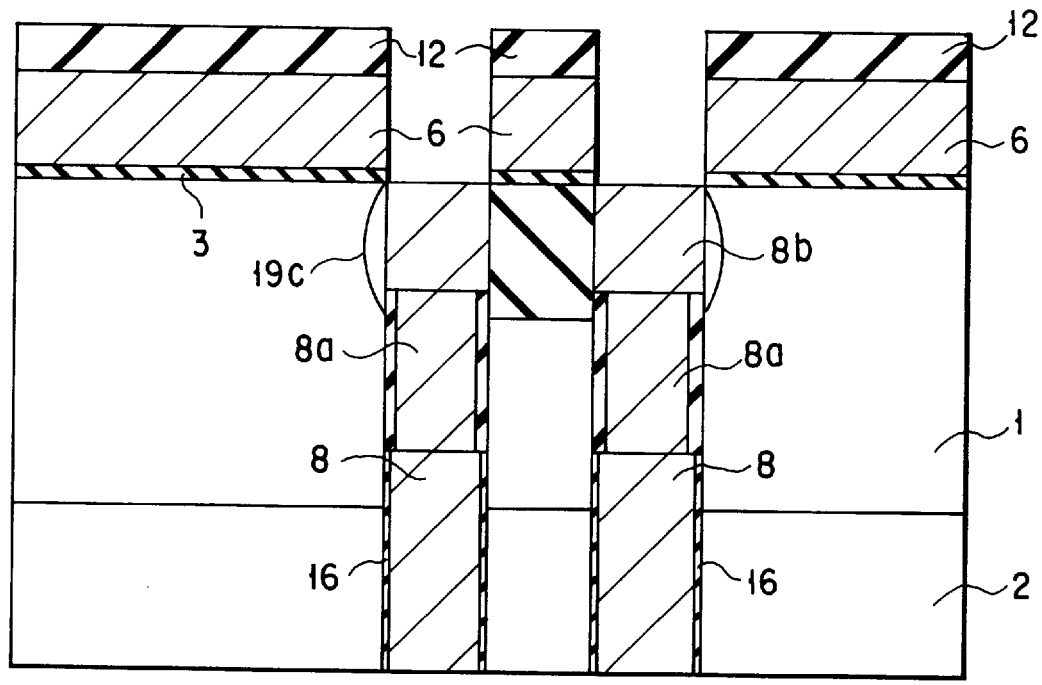
FIG. 25 is a cross-sectional view explaining a manufacturing process following on the process of FIG. 24.

Moreover, as shown in FIG. 25, the second polycrystalline silicon film 8b is removed up to the level, which is substantially the same as the surface of the semiconductor substrate, so as to bury the second polycrystalline silicon film 8b in the upper portion of the opening portion 13.

At this time, the impurity material such as arsenic, which is added to the first polycrystalline silicon film 8a, is diffused in the second polycrystalline silicon film 8b, so that the diffusion layer 19c is formed on the side surface of the opening portion 13. In this case, the diffusion layer 19c can be formed by the following process.

Specifically, n-type impurity material such as arsenic is added to the second polycrystalline silicon film 8b. Then, impurity material is diffused to the side wall surface of the opening portion 13 from the second polycrystalline silicon film 8b so as to form the diffusion layer 19c. However, in this case, concentration of the diffusion layer 19c is increased, and leak current may be increased.

Therefore, as explained in this embodiment, the impurity material such as arsenic, which is added to the first polycrystalline silicon film 8a, is diffused in the second polycrystalline silicon film 8b without adding impurity material to the second polycrystalline silicon film 8b, so that the diffusion layer 19c is formed. Thereby, concentration of the diffusion layer 19c can be reduced, and leak current from the diffusion layer 19c to the p-well 1 can be controlled.

Thereafter, the insulating film 12 and the conductive film 6 are etched by e.g., lithography and anisotropic etching such as RIE so as to form the gate electrode 6 of the transistor. In this case, similar to the first and second embodiments, the gate electrode 6 is processed by the pattern, which is separated to be island-shaped as shown in FIG. 19B.

Figure 26:
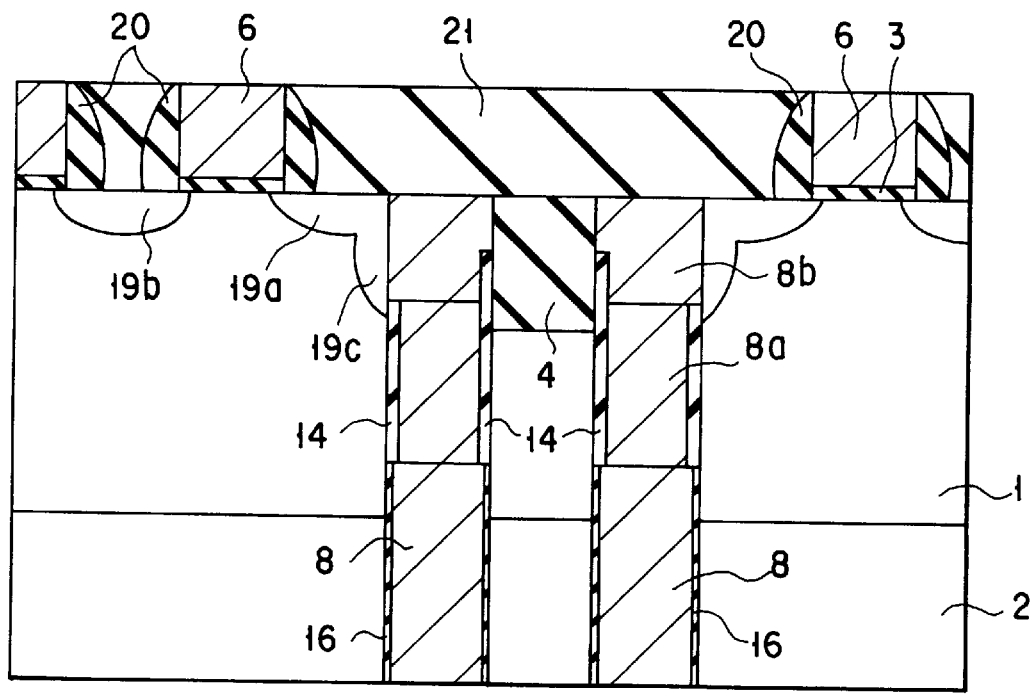
FIG. 26 is a cross-sectional view explaining a manufacturing process following on the process of FIG. 25.

Moreover, as shown in FIG. 26, the n-type diffusion layer 19a and 19b are formed by e.g., ion-implantation, and the diffusion layer 19a is connected to the diffusion layer 19c, which is formed on the side wall surface of the opening portion 13. Next, similar to the first and second embodiments, the side wall insulating film 20 is formed on the gate electrode 6 and the side wall of the insulating film 12.

Moreover, the interlayer insulating film 21 is formed to completely fill the spatial region between the gate electrodes 6. Then, the interlayer insulating film 21 is removed by a flattening technique such as CMP till the surface of the gate electrode 6 is exposed.

In the first and second embodiments, the connection electrode 10 was formed to connect the diffusion layer 19a to the storage electrode 8. In the third embodiment, since the diffusion layer 19a and the storage electrode 8 are already connected to each other through the diffusion layer 19c, it is unnecessary to form the connection electrode 10.

Then, in the following process, similar to the first and second embodiments, the word line 5 and the bit line are formed by the burying technique, so that the semiconductor memory device as shown in FIG. 20 is completed.

Thus, according to this embodiment, the storage electrode 8 and the source of the transistor or the drain diffusion layer 19a are connected to each other by the diffusion layer 19c formed on the side wall surface of the opening portion 13.

Moreover, according to this embodiment, the diffusion layer 19c is formed by the following process.

Specifically, the second polycrystalline silicon film 8b is formed to contact the side wall surface exposed by removing the insulatiang film 14 of the upper portion of the opening portion 13. Then, impurity material is diffused to the side wall surface of the opening portion 13 from the second polycrystalline silicon film 8b.

As a result, as compared with the first and second embodiments in which the connection electrode 10 is formed on the semiconductor substrate, the word line 5 and the storage electrode 8 can be prevented from being short-circuited. In other words, in the first and second embodiments, since the connection electrode 10 was formed on the semiconductor substrate 10, the interlayer insulating film 21 between the connection electrode 10 and the word line was thick. Due to this, the quality of the interlayer insulating film 21 must be improved to prevent the short-circuit between the connection electrode 10 and the word line and unfavorable influence of the potential of the word line 5 on the storage electrode.

In contrast, according to this embodiment, the storage electrode 8 is connected to the source of the transistor or the drain diffusion layer 19a through the diffusion layer 19c formed on the side wall surface of the opening portion 13 of the semiconductor substrate. As a result, the distance between the storage electrode 8 and the word line 5 can be ensured, and the occurrence of the short-circuit therebetween can be prevented.

In the first and second embodiments, the word line 5 was formed to directly contact the surface of the gate electrode 6. Due to this, it was needed that the surface level of the connection electrode 10 be lower than that of the gate electrode to prevent the word line 5 and the connection electrode 10 from being short-circuited. In this case, the surface level must be strictly controlled when the connection electrode 10 is formed by the burying technique such as etching back.

In contrast, according to the third embodiment, it is needed that the side wall insulating film 14 of the opening portion 13 be removed to form the diffusion layer 19a. Due to this, the first polycrystalline silicon film 8b of the upper portion of the opening portion 13 is removed by etching back. However, there is no need that the first polycrystalline silicon film 8b is strictly controlled as compared with the etching back process of the connection electrode 10.

Thus, according to this embodiment, no strict control is needed, and the word line 5 and the storage electrode 8 can be easily prevented from being shortcircuited.

Moreover, in the first and second embodiments, it was needed that patterning as shown by the pattern 10 in FIG. 3 be provided to exposure the diffusion layer 19a and the storage electrode 8 in forming the connection electrode 10.

In the contrast, according to the third embodiment, in forming the diffusion layer 19c for connecting the diffusion layer 19a to the storage electrode 8, the the first polycrystalline silicon film 8a is removed by etching back. As a result, the side wall surface of the opening portion 13 is exposed, no patterning is needed, and the manufacturing process can be largely shortened.

Moreover, according to this embodiment, the storage electrode 8, which is formed of e.g., a metal film, is buried in mid of the opening portion 13. Then, the conductive films 8a and 8b such as polycrystalline silicon films are formed on the upper portion of the opening portion 13. It is desirable that the storage electrode 8 be formed of not the polycrystalline silicon film but the metal film, e.g., TiN to thin the capacitor insulating film of the high dielectric film.

In a case where the storage electrode 8 is formed such that such a metal film directly comes in contact with the diffusion layer 19c, there is possibility that the leak current from the diffusion layer 19c will be increased by diffusing the metal of the metal film into the semiconductor substrate. Due to this, the manufacturing process becomes complicated, for example, the necessity of forming the barrier metal.

Due to this, according to this embodiment, the polycrystalline silicon film is buried onto the storage electrode 8 so as to ensure the distance between the diffusion layer 19c and the metallic film. Thereby, the leak current from the diffusion layer 19c can be reduced.

Moreover, n-type diffusion layer 19a, which is connected to the storage electrode, an n well, and the storage electrode constitute a parasitic transistor having a storage electrode as a gate electrode.

Due to this, the semiconductor substrate, which faces to the storage electrode at the side surface of the opening portion 13 of p-well, forms a reverse layer by the potential of the storage electrode, and the transistor is turned on. As a result, there is possibility that the current will be leaked from the storage electrode. In order to prevent such a problem, the thick insulating film 14 is formed on the side wall of the upper portion of the opening portion 13.

Figure 27:
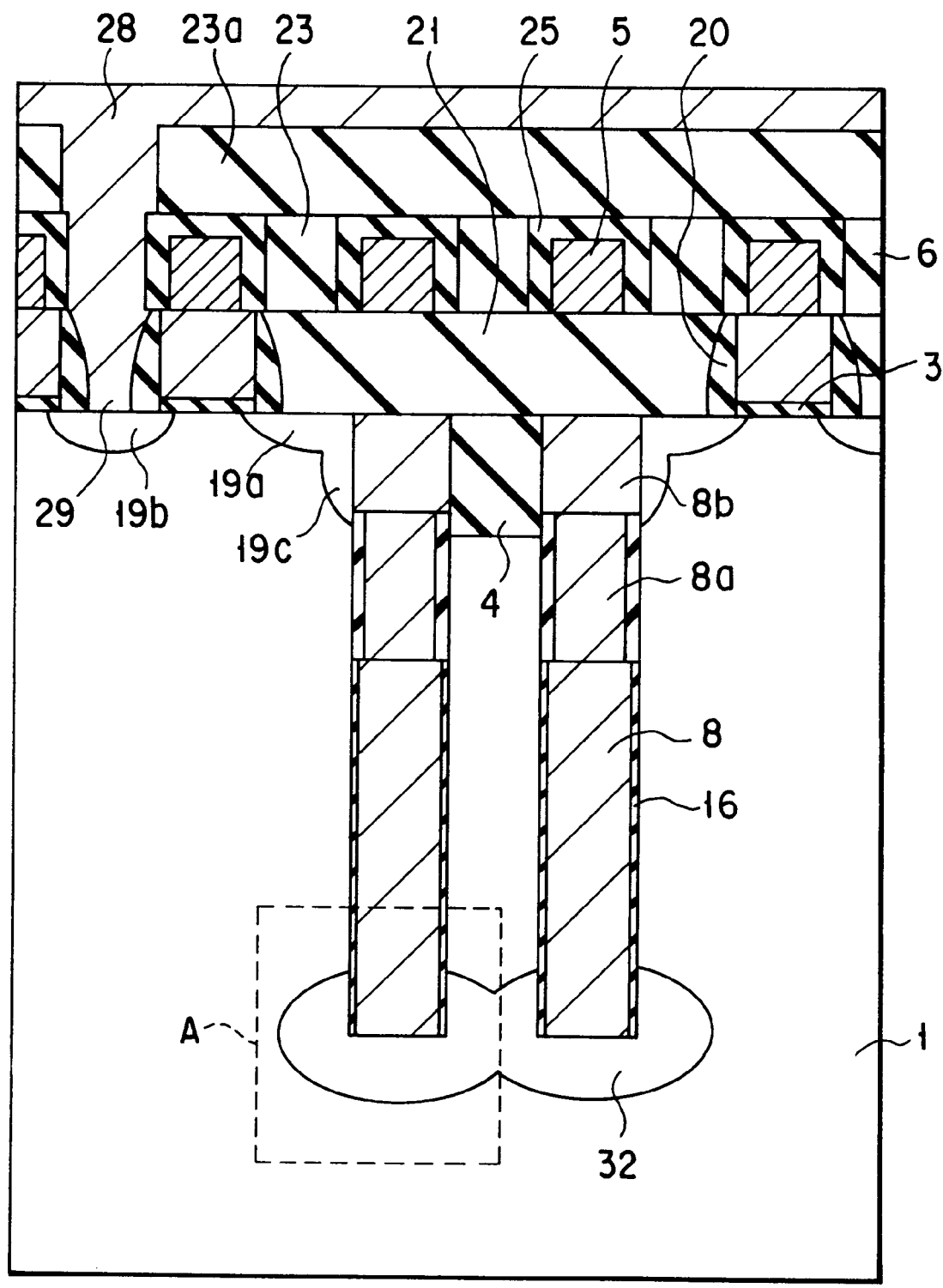
FIG. 27 is a cross-sectional view explaining a manufacturing process corresponding to the cross-sectional view, taken along a line XXA—XXA as indicated by arrows in FIG. 19A, of a semiconductor memory device having a different capacitor structure according to a fourth embodiment of the present invention.
Figure 28:
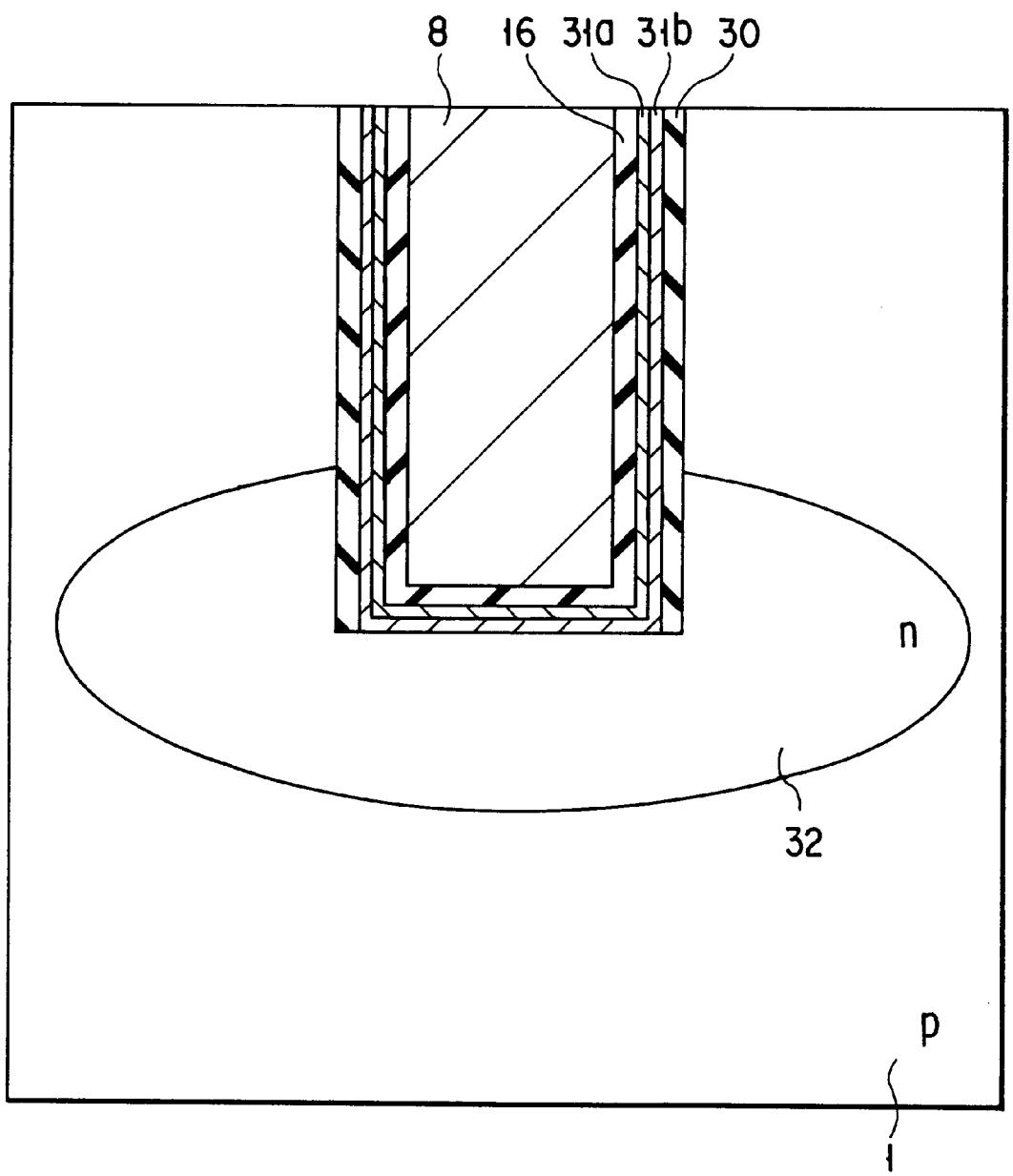
FIG. 28 is an enlarged view of a region A shown in FIG. 27.

Next, the following will explain the semiconductor memory device having a different capacitor structure according to a fourth embodiment of the present invention with reference to FIGS. 27 and 28.

FIG. 27 is a cross-sectional view showing the structure of the semiconductor memory device according to this embodiment, and FIG. 28 is an enlarged view of an area A of FIG. 27.

In this case, the upper surface view is the same as shown in FIG. 19, and FIG. 27 is a cross-sectional view explaining a manufacturing process corresponding to the cross-sectional view, taken along a line XXA—XXA as indicated by arrows in FIG. 19A.

Unlike the first, second, and third embodiments in which the plate electrode is formed of e.g., n-type semiconductor substrate 2, the plate electrode of the fourth embodiment is formed as follows.

Specifically, the plate electrode is formed of a metal film 31 such as ruthenium (Ru), which is formed in the opening portion 13 through an insulating film 30 such as an oxide film (SiO$_2$).

Similar to the first to third embodiments, the storage electrode 8 is formed in the inside of the metal film 31 through the capacitor insulating film 16. The metal film 31 and the storage electrode 8 constitute the capacitor.

To apply the potential to the metal film 31, the metal film 31 is connected to an n-type diffusion layer 32 through a barrier metal 31a such as T1 at the bottom surface of the opening portion 13. The n-type diffusion layer 32 is formed on the bottom surface area of the opening portion 13. The diffusion layers 32 of the adjacent memory cells are electrically connected to each other to be superimposed on each other.

Moreover, though this is not shown in the figure, the diffusion layers 32 electrically connected to each other are connected to the electrode, which is formed on the surface of the semiconductor substrate at the end of the cell region where the memory cells are integrated. Then, the plate potential is applied to the metal film 31 through the electrode.

In the first to third embodiments, to separate the potential of the plate electrode and the substrate bias of the transistor, the plate electrode was formed of the n-type semiconductor substrate or n-well 2. Then, the transistor was formed in the p-well 1. According to the fourth embodiment, the transistor and the opening portion 13 are formed in the p-well 1. Then, the n-type diffusion layer 32 is formed in only the bottom surface area of the groove. Thereby, the plate potential and the substrate bias of the transistor can be separated.

If the metallic film 31 constituting the plate electrode is connected to the bottom surface of the groove, the n-type diffusion layer 32 can be replaced with the n-well.

Thus, according to this embodiment, the plate electrode is formed of metal films 31a and 31b.

In the first to third embodiments, the plate electrode was formed of the semiconductor substrate. Due to this, if the capacitor insulating film 16 is formed of the high dielectric film such as Ta$_2$O$_5$, oxygen in the capacitor insulating film 16 reacts with the semiconductor substrate, so that the oxide film is formed between the capacitor insulating film 16 and the semiconductor substrate.

As a result, the thickness of the capacitor insulating film 16 is increased, and the capacitance is reduced. Due to this, there is possibility that the effect derived from the use of the high dielectric film will not be sufficiently obtained. In contrast, according to the fourth embodiment of the present invention, the plate electrode is formed of the metal film whose oxide material is metallic conductivity, e.g., Ru film. As a result, the insulating oxide film is prevented from being formed between the capacitor insulating film 16 and the plate electrode, so that the capacitance can be sufficiently obtained.

In the first to third embodiments, the metallic obfilm, e.g., W is selectively formed on the side wall surface of the opening portion 13, so that the capacitance can be surely obtained. However, in this case, the metallic film contacts the semiconductor substrate. As a result, there is possibility that the metal will be diffused to the semiconductor substrate and the leak current will be increased. To solve such a problem, for example, it is needed that the barrier metal be formed to control such possibility.

In contrast, according to this embodiment, the metallic films 31a and 31b constituting the plate electrode are formed in the opening portion 13 through the insulating film 30 to come in contact with the semiconductor substrate at only the portion of the opening portion 13. As a result, the possibility of generating the leak current can be reduced.

In the first to third embodiments, there is possibility that the current will be leaked to an n-well 2 from the diffusion layer 19c by the parasitic transistor using the storage electrode 8 as a gate electrode between the diffusion layer 19c and the n-well 2 constituting the plate electrode. To solve this problem, it is needed that the thick side wall oxide film 14 be formed.

In contrast, according to this embodiment, the plate electrodes 31a and 31b are formed in the opening portion 13 through the insulating film 30. The distance between the diffusion layer 32, which is structured to have the same potential as the plate electrode, and the diffusion layer 19c is large. As a result, the possibility of the current leakage from the diffusion layer 19c to the plate electrode can be almost ignored.

In the first to fourth embodiments, at the time of forming the opening portion 13, the gate insulating film 3 on the semiconductor substrate, the conductive film 6, serving as a gate electrode, and the insulating film 12, e.g., silicon nitride film, on the gate electrode, were formed. Then, the insulating film 12 was used as a mask, so that the first opening portion 13 was formed. However, the first opening portion 13 can be formed as follows:

For example, an insulating film, e.g., silicon oxide film is further formed on the insulating film 12, and the silicon oxide film is used as a mask, so that the first opening portion 13 can be formed.

Thus, in the process of forming the groove in the semiconductor substrate, the mask layer such as the insulating film 12 formed on the conductive layer 6, serving as a gate electrode, can be set to have a suitable material and a suitable thickness by the opening area of the groove, the depth, and the shape.

The above first to fourth embodiments explained the memory cell structure in which two word lines pass per one cell. In this case, if the minimum processing size is set to F, the area of one memory cell is about 8×F$^2$. However, the present invention can be applied to the memory cell whose area is about 6×F$^2$ as shown in FIG. 29 or FIG. 30.

In this case, one and half word lines pass per one cell.

FIGS. 29 and 30 are upper surface views of the semiconductor memory device of the present invention having the memory cell area of 6×F$^2$, and each of these figures shows the structure corresponding to the first embodiment of FIG. 3. In other words, the semiconductor memory device comprises the conductive layer having the gate electrode 6 and the word line 5 are different from each other. The storage electrode 8 is formed in the opening portion 13, and the storage electrode 8 and the source of the transistor or the drain diffusion layer 19a are electrically connected to each other by the connection electrode 10.

In the first to third embodiment, the transistor, the connection electrode, and the capacitor were linearly arranged. According to the fourth embodiment, the connection electrode 10 is provided to be at right angles with the bit line.

Moreover, FIG. 30 shows the structure in which the diameter of the opening portion 13 of FIG. 29 is reduced. If the capacitor insulating film is formed of the high dielectric film and sufficient capacitor capacitance can be ensured, the diameter of the opening portion 13 can be reduced.

As a result, even in a case where the capacitor is formed after forming the gate electrode 6, the gate electrode 6 can be continuously formed without being isolated. Due to this, in this arrangement, the word line 5, which is formed of the conductive layer, which is different from the gate electrode 6, is not always needed.

In the memory cell of the first to fourth embodiment, the semiconductor memory device comprises the conductive layer having the gate electrode 6 and the word line 5 are different from each other. However, in a peripheral circuit for driving the memory cell, the line layer can be formed of the conductive layer only the word line 5.

The following will explain the fifth embodiment of the present invention showing the case in which the word line 5 is used as a line layer in a flip-flop circuit with reference to FIGS. 31 to 34.

FIG. 31 is an upper surface view of the circuit according to the fifth embodiment of the present invention, and FIG. 32 is a cross-sectional view taken along a line XXXA—XXXA as indicated by arrows in FIG. 31.

In this embodiment, a transistor T2 is formed in the area, which is shown by a one-dot chain line of FIG. 31. As shown in these figures, the feature of this embodiment lies in that the line layer for connecting the gate electrode 6 to the diffusion layer 19 is formed of the word line 5. In this case, one end of the word line 5 is formed to be directly connected to the surface of the gate electrode 6, and the other end is connected to the diffusion layer 19 through a connection hole 29a.

Next, the following will explain the manufacturing method with reference to the FIGS. 33 and 34 showing the manufacturing processes.

Similar to the first to fourth embodiments, the gate electrode 6 is formed on the semiconductor substrate 1 so as to form the diffusion layer 19 in the surface region of the semiconductor substrate 1. Thereafter, the interlayer insulating film 21 is buried in the spatial region between the electrodes 6, and the interlayer insulating film 23 is further formed.

In this case, unlike the first to fourth embodiments, as shown in FIG. 33, before the groove 24 for forming the word line 5 is formed, the interlayer insulating film 23 and the part of the interlayer insulating film 21 are opened such that the diffusion layer 19 is exposed. As a result, the connection hole 29 is formed.

Next, similar to the first to fourth embodiments, the interlayer insulating film 23 is removed till the surface off the gate electrode 6 is exposed, so that the groove 24 is formed.

Moreover, the side wall insulating film 25 is formed on the groove 24 and the side wall of the connection hole 29a.

Next, the word line 5 of the memory cell is formed such that the interior of the connection hole 29a and that of the groove 24 are filled with the word line 5. Thereafter, similar to the first to fourth embodiments, the word line 5 is buried in the connection hole 29 and the groove 24 by CMP or etching back. As a result, the structure shown in FIG. 32 is completed.

Thus, according to this embodiment, the conductive layer 5, which constitutes the word line in the memory cell, is formed as a line layer for connecting the gate electrode 6 to the diffusion layer 19.

In conventional, for connecting the gate electrode 6 to the diffusion layer 19, it was needed that such a connection be made through the bit line 28 or Al line of the upper layer. Since the line layers were arranged on the upper layer through the interlayer insulating film, the depth of the connection hole was largely increased. Particularly, when the diameter of the connection was reduced in accordance with the highly integration, the interior of the fine connection hole was not fully filled with the conductive film. As a result, the connection resistance was increased.

However, according to this embodiment, the word line 5 is formed to have a level enough to contact the surface of the gate electrode 6. As a result, as compared with the conventional case, it is possible to reduce the depth of the connection hole for connecting the word line 5 to the diffusion layer 19.

Thus, the interior of the connection hole can be fully filled with the conductive film, and the connection resistance can be reduced.

In the above-explained embodiments, the polycrystalline silicon film was used as gate electrode 6. However, the present invention is not limited to such material. It is possible to use a layer film of the polycrystalline silicon film and a silicide film such as WSi, TSi, or the conductive film such as W, TiN. In this case, as the polycrystalline silicon layer, it is possible to use an $n^+$polycrystalline silicon film to which n-type impurity material such as phosphorus is added or a $p^+$polycrystalline silicon film to which impurity material such as boron is added.

Moreover, an $n^+$polycrystalline silicon film can be used as the gate electrode of the n-type transistor, and a $p^+$polycrystalline silicon film can be used as the gate electrode of the p-type transistor. Thus, the polycrystalline silicon film having a different type can be used in accordance with the type of the transistor.

Furthermore, as word line 5, it is possible to use the metallic film such as W or Al. It is also possible to use the other metallic film such as TiN or the conductive film such as the silicide film of e.g., WSi. In this case, as the conductive film for forming the word line 5, the conductive film having a low resistance is preferably used to reduce the line resistance. Moreover, as bit line 28, similar to the word line, it is possible to use various types of films such as W or Al, which has a low resistance.

In the first and second embodiments, W was used as connection electrode 10. However, the present invention is not limited to this material, and for example, WSi, TiN, TiSi, or the other conductive films such as non-crystal silicon can be used. The connection electrode 10 can be formed by etching as in the first embodiment. Also, the connection electrode 10 can be formed by a selective growth as in the second embodiment. As the selective growth, a selective epitaxial growth of silicon other than the selective CVD of W can be used.

In a case where $Ta_2O_5$ is used as a high dielectric film forming the capacitor insulating film 16, the capacitor insulating film having an effective thickness of 0.8 nm to 2.5 nm can be formed. At this time, the semiconductor substrate is used as a plate electrode, and the conductive film such as TiN or W can be used as a storage electrode.

In a case where BSTO ($Sr_{1-x}Ba_xTiO_3$, barium strontium titanium oxide) is used as a high dielectric film forming the capacitor insulating film 16, the capacitor insulating film having an effective thickness of 0.1 nm to 0.5 nm can be formed. At this time, the conductive film such as Ru, Pt, $RuO_2$, WN, W, TiN can be used as a plate electrode and a storage electrode. As mentioned above, the semiconductor memory device of the present invention comprises the transistor and the capacitor. The gate electrode of the transistor is structured to be separated to be island-shaped in the region other than the opening portion formed in the semiconductor substrate for forming the capacitor. Due to this, after forming the gate insulating film and the gate electrode on the semiconductor substrate, the opening portion is formed in the semiconductor substrate, so that the capacitor can be formed.

As a result, it is unnecessary to carry out the thermal process for forming the gate insulating film after forming the capacitor insulating film using the high dielectric film. Then, the quality of the capacitor insulating film can be prevented from being changed. Thus, the high dielectric film can be used as a capacitor insulating film.

The semiconductor memory device of the present invention includes the line layer for connecting the gate electrode separated to be island-shaped. Then, the line layer is formed of the conductive layer, which is different from the gate electrode. As a result, after forming the capacitor, the line layer can be formed and the gate electrode can be connected thereto.

According to the semiconductor memory device of the present invention, the line layer is structured to directly contact the surface of the gate electrode. The level difference, which is caused by forming the gate electrode and the line layer of the different conductive layer, can be prevented from being increased.

According to the semiconductor memory device of the present invention in which the line layer forms the word line, the signal can be transmitted to each gate electrode through the word line so as to drive the semiconductor memory device.

According to the semiconductor memory device of the present invention in which the line layer is structured to pass the upper portion of the opening portion, the semiconductor memory device can be highly integrated.

Moreover, the semiconductor memory device of the present invention comprises connection means, which is formed of the conductive film to contact the source of the transistor or the surface of the drain diffusion layer and the surface of the storage electrode. As a result, the source of the transistor or the drain diffusion layer and the storage electrode can be connected to each other by the conductive film.

In the conventional semiconductor memory device in which the gate electrode and the line layer are formed of the same conductive layer, it was needed that the conductive film, serving as connection means, be formed in the extremely small space between the gate electrode and the line layer. As a result, it was difficult to obtain a sufficient contact area between the conductive film and the diffusion layer or the storage electrode.

In contrast, according to the semiconductor memory device of the present invention, since the gate electrode and the line layer or word line are formed of the different conductive layer, the line layer can be formed on the upper portion of the conductive film, serving as connection means. As a result, the contact area, which is sufficient enough to form the conductive film, can be obtained. Even in a case where the semiconductor memory device is highly integrated, the connection resistance can be reduced.

Moreover, according to the present invention, connection means for connecting the source or the drain diffusion layer and the storage electrode to each other is structured to be connected to the source or the drain diffusion layer and connected to the storage electrode at the upper portion side wall surface of the opening portion. As a result, the source or the drain diffusion layer can be connected to the storage electrode through the diffusion layer. Moreover, connection means is formed of the diffusion layer formed on the side wall surface of the opening portion. As a result, the distance between connection means and the line layer can be increased, so that the short-circuit between connection means and the line layer can be prevented as compared with the case in which connection means is formed of the conductive film formed on the source or the surface of the drain diffusion layer.

Moreover, according to the semiconductor memory device of the present invention in which the plate electrode is formed of the semiconductor substrate, the storage electrode is formed in the interior of the opening portion. As a result, the current can be prevented from being leaked from the storage electrode. Since the plate electrode is formed of the semiconductor substrate, the process for forming the plate electrode can be omitted, and the manufacturing process can be simplified.

As explained above, the semiconductor memory device of the present invention is formed of the conductive film, which is electrically separated from the semiconductor substrate by the insulating film having the plate electrode formed on the inner wall surface of the opening portion. According to the above-structured semiconductor memory device of the present invention, the plate electrode is formed in the opening portion to be separated from the semiconductor substrate. As a result, it is possible to reduce the possibility of the current leakage between the source connected to the storage electrode or the other electrode such as the drain diffusion layer and the plate electrode. In a case where the high dielectric film is used as a capacitor insulating film, the boundary surface, which comes in contact with the capacitor insulating film at the plate electrode, is preferably formed of the metallic layer. However, in this case, the metallic layer and the semiconductor substrate are separated from each other, so that they can be prevented from being directly contact each other. As a result, it is possible to restrain the possibility of increasing the leak current caused by the metallic layer.

As explained above, the semiconductor memory device of the present invention in which the boundary surface, which comes in contact with the storage electrode or the capacitor insulating film, the high dielectric film and the storage electrode or the plate electrode react with each other. As a result, a new insulating layer is formed, and the capacitor insulating film can be effectively prevented from being increased.

Moreover, according to the method for manufacturing the semiconductor memory device of the present invention, the conductive layer and the part of the semiconductor substrate are etched to form the opening portion after forming the conductive layer having the gate electrode on the semiconductor substrate through the gate insulating film. Then, the capacitor is formed in the opening portion. As a result, the gate insulating film can be formed before forming the capacitor insulating film, and no thermal process can be carried out after forming the capacitor insulating film.

As mentioned above, the semiconductor memory device of the present invention comprises the transistor and the capacitor. The gate electrode of the transistor is structured to be separated to be island-shaped in the region other than the opening portion formed in the semiconductor substrate for forming the capacitor. Due to this, after forming the gate insulating film and the gate electrode on the semiconductor substrate, the opening portion is formed in the semiconductor substrate, so that the capacitor can be formed.

As a result, it is unnecessary to carry out the thermal process for forming the gate insulating film after forming the capacitor insulating film using the high dielectric film. Then, the quality of the capacitor insulating film can be prevented from being changed. Thus, the high dielectric film can be used as a capacitor insulating film.

The semiconductor memory device of the present invention includes the line layer for connecting the gate electrode separated to be island-shaped. Then, the line layer is formed of the conductive layer, which is different from the gate electrode. As a result, after forming the capacitor, the line layer can be formed and the gate electrode can be connected thereto.

According to the semiconductor memory device of the present invention, the line layer is structured to directly contact the surface of the gate electrode. The level difference, which is caused by forming the gate electrode and the line layer of the different conductive layer, can be prevented from being increased.

According to the semiconductor memory device of the present invention in which the line layer forms the word line, the signal can be transmitted to each gate electrode through the word line so as to drive the semiconductor memory device.

According to the semiconductor memory device of the present invention in which the line layer is structured to pass the upper portion of the opening portion, the semiconductor memory device can be highly integrated.

Moreover, the semiconductor memory device of the present invention comprises connection means, which is formed of the conductive film to contact the source of the transistor or the surface of the drain diffusion layer and the surface of the storage electrode. As a result, the source of the transistor or the drain diffusion layer and the storage electrode can be connected to each other by the conductive film.

In the conventional semiconductor memory device in which the gate electrode and the line layer are formed of the same conductive layer, it was needed that the conductive film, serving as connection means, be formed in the extremely small space between the gate electrode and the line layer. As a result, it was difficult to obtain a sufficient contact area between the conductive film and the diffusion layer or the storage electrode.

In contrast, according to the semiconductor memory device of the present invention, since the gate electrode and the line layer are formed of the different conductive layer, the line layer can be formed on the upper portion of the conductive film, serving as connection means. As a result, the contact area, which is sufficient enough to form the conductive film, can be obtained. Even in a case where the semiconductor memory device is highly integrated, the connection resistance can be reduced.

Moreover, according to the present invention, connection means for connecting the source or the drain diffusion layer and the storage electrode to each other is structured to be connected to the source or the drain diffusion layer and connected to the storage electrode at the upper portion side wall surface of the opening portion. As a result, the source or the drain diffusion layer can be connected to the storage electrode through the diffusion layer. Moreover, connection means is formed of the diffusion layer formed on the side wall surface of the opening portion. As a result, the distance between connection means and the line layer can be increased, so that the short-circuit between connection means and the line layer can be prevented as compared with the case in which connection means is formed of the conductive film formed on the source or the surface of the drain diffusion layer.

Moreover, according to the semiconductor memory device of the present invention in which the plate electrode is formed of the semiconductor substrate, the storage electrode is formed in the interior of the opening portion. As a result, the current can be prevented from being leaked from the storage electrode. Since the plate electrode is formed of the semiconductor substrate, the process for forming the plate electrode can be omitted, and the manufacturing process can be simplified.

As explained above, the semiconductor memory device of the present invention is formed of the conductive film, which is electrically separated from the semiconductor substrate by the insulating film having the plate electrode formed on the inner wall surface of the opening portion. According to the above-structured semiconductor memory device of the present invention, the plate electrode is formed in the opening portion to be separated from the semiconductor substrate. As a result, it is possible to reduce the possibility of the current leakage between the source connected to the storage electrode or the other electrode such as the drain diffusion layer and the plate electrode. In a case where the high dielectric film is used as a capacitor insulating film, the boundary surface, which comes in contact with the capacitor insulating film at the plate electrode, is preferably formed of the metallic layer. However, in this case, the metallic layer and the semiconductor substrate are separated from each other, so that they can be prevented from being directly contact each other. As a result, it is possible to restrain the possibility of increasing the leak current caused by the metallic layer.

As explained above, the semiconductor memory device of the present invention in which the boundary surface, which comes in contact with the storage electrode or the capacitor insulating film, the high dielectric film and the storage electrode or the plate electrode react with each other. As a result, a new insulating layer is formed, and the capacitor insulating film can be effectively prevented from being increased.

Moreover, according to the method for manufacturing the semiconductor memory device of the present invention, the conductive layer and the part of the semiconductor substrate are etched to form the opening portion after forming the conductive layer having the a gate electrode on the semiconductor substrate through the gate insulating film. Then, the capacitor is formed in the opening portion. As a result, the gate insulating film can be formed before forming the capacitor insulating film, and no thermal process can be carried out after forming the capacitor insulating film.

Therefore, even in a case where the capacitor insulating film is formed of the highly dielectric film, the quality of the capacitor insulating film can be prevented from being changed by the thermal process after forming the capacitor insulating film. Moreover, according to the manufacturing method of the present invention, after the capacitor is formed, the conductive layer is etched to form the gate electrode, and the line layer for connecting the gate electrode is formed. As a result, the gate electrode, which is separated in the opening portion forming process, can be connected to the line layer.

Furthermore, according to the manufacturing method of the semiconductor memory device of the present invention, the gate insulating film is formed on the semiconductor substrate. Then, the first conductive layer, which constitutes the gate electrode, is formed on the gate insulating film and the element separation layer. Thereafter, the insulating film whose part is opened is formed on the first conductive layer. The insulating film is used as a mask, and the conductive layer and the semiconductor substrate is etched so as to form the opening portion in the semiconductor substrate. Then, the capacitor insulating film is formed on the inner wall surface of the opening portion. As a result, similar to the above-mentioned manufacturing method, it is possible to prevent the thermal process from being carried out after forming the capacitor insulating film. Therefore, the quality of the capacitor insulating film can be prevented from being changed by the thermal process at the time of using the high dielectric film as a capacitor insulating film.

Moreover, the interior of the opening portion is filled with the storage electrode layer, and the first conductive layer is etched to form the gate electrode. Then, the source having the second conductive type or the drain diffusion layer is formed in the semiconductor substrate on both sides of the gate electrode. Thereafter, since the connection electrode for connecting the diffusion layer to the storage electrode layer is formed, the diffusion layer and the storage electrode can be connected to each other by the connection electrode.

The interlayer insulating film is formed to cover the connection electrode and the gate electrode. Then, the part of the interlayer insulating film is removed, and the surface of the gate electrode is exposed so as to form the groove. Since the interior of the groove is filled with the second conductive layer forming the line layer, the gate electrode, which is separated in the opening portion forming process, can be connected to the line layer. The line layer is formed by filling the interior of the groove, which is formed in the interlayer insulating film, with the conductive layer. By the formation of the line layer, the level difference can be prevented from being increased. The groove is formed in the interlayer insulating film to expose the surface of the gate electrode, and the line layer is formed to contact the gate electrode at the exposed surface. As a result, it is unnecessary to form the connection hole for connecting the line layer to the gate electrode. Since it is unnecessary to ensure allowance of pattern alignment between the connection hole and the gate electrode, the semiconductor memory device can be fined. Also, since there is no need of forming the connection hole, the process can be simplified.

Moreover, according to the manufacturing method of the semiconductor memory device of the present invention, in the process for forming the gate electrode, the first conductive layer is etched by use of the mask layer having the pattern separated to be island-shaped. The first conductive layer is left on only the transistor region so as to form the gate electrode, and the first conductive layer formed in the other regions is removed. The area of the electrode, e.g., the connection electrode, which is formed in the region where the first conductive layer is removed, can be increased. As a result, the degree of freedom of design can be increased, and the high density of the semiconductor memory device can be improved.

According to the manufacturing method of the semiconductor memory device of the present invention, after filling the interior of the opening portion with the storage electrode layer, the region, where the first conductive layer is removed to form the opening portion, is filled with the insulating layer. Thereby, the insulating layer is flattened such that the surface of the insulating layer and that of the insulating film on the first conductive layer is structured to have a single plane. In the above-mentioned manufacturing method of the semiconductor memory device of the present invention, the surface of the insulating layer is flattened when the first conductive layer is patterned and the gate electrode is processed. As a result, the lithography process and the etching process can be easily carried out.

Moreover, according to the manufacturing method of the semiconductor memory device of the present invention, the first conductive layer and the part of the insulating layer are etched by use of the mask layer having a belt-like pattern so as to form the gate electrode. Then, the residual insulating layer and the gate electrode are used as a mask, and the conductive layer is selectively formed on the diffusion layer and the storage electrode so as to connect the diffusion layer to the storage electrode. According to the manufacturing method of the semiconductor memory device of the present invention, the connection electrode is formed to be self-aligned with the insulating layer, which is left by patterning when the gate electrode is formed, and the gate electrode. As a result, the lithography process can be omitted, so that the manufacturing process can be simplified.

According to the manufacturing method of the semiconductor memory device of the present invention, the interior of the opening portion is filled with the storage electrode layer to bring the side wall surface of the opening portion in contact with the storage electrode layer in the upper region of the opening portion. Thereby, the diffusion layer having the second conductive type is formed on the side wall surface. After forming the gate electrode, the source or the drain diffusion layer is formed to be connected to the diffusion layer having the second conductive type. As a result, the source or the diffusion layer and the storage electrode can be connected to each other by the diffusion layer formed on the side wall surface of the upper portion of the opening portion. At this time, the conductive film of the upper portion of the opening portion is removed by etching back, and the insulating film formed o the side wall of the opening portion is removed. Thereafter, the opening portion is filled with the conductive film again, so that the side wall surface of the upper portion the side wall surface of the opening portion and the storage electrode layer are connected to each other, and the lithography step can be omitted. As a result, as compared with the method for forming the connection electrode on the source or the surface of the drain diffusion layer and the surface of the storage electrode, the manufacturing process can be simplified.

Moreover, according to the manufacturing method of the semiconductor memory device of the present invention, after forming the interlayer insulating film to cover the gate electrode, the connection hole is formed to expose the part of the semiconductor substrate. Then, the part of the exposed semiconductor substrate and the gate electrode are connected to each other through the connection hole by the line layer. Thus, the gate electrode and the diffusion layer of the semiconductor substrate can be connected to each other by the line layer for connecting the gate electrode. As a result, the degree of freedom of the design can be increased, and the semiconductor memory device can be further highly integrated.

Additional advantages and modifications will readily occur to those skilled in the art. Therefore, the invention in its broader aspects is not limited to the specific details and representative embodiments, shown and described herein. Accordingly, various modifications may be made without departing from the spirit or scope of the general inventive concept as defined by the appended claims and their equivalents.

We claim:

1. A semiconductor memory device comprising:
   at least one MOS transistor formed on a semiconductor substrate;
   a capacitor formed in an interior space of an opening portion formed in said semiconductor substrate adjacent to said at least one MOS transistor; and
   a line layer connected to a gate electrode of said MOS transistor, said gate electrode being an island-shaped gate electrode separated from a region where said opening portion is formed, wherein said line layer is formed as a conductive layer at a different level above a level where said island-shaped gate electrode is formed, and wherein said line layer serves to connect said island-shaped gate electrode to at least one other gate electrode associated with another MOS transistor.

2. The device according to claim 1, wherein said line layer forms a word line.

3. The device according to claim 1, wherein said line layer is formed to pass an upper portion of said opening portion.

4. The device according to claim 2, wherein said line layer is formed to pass an upper portion of said opening portion.

5. The device according to claim 1, wherein said capacitor insulating film is between a storage electrode and said semiconductor substrate.

6. A semiconductor memory device according to claim 1, further comprising a connection electrode being formed only on said semiconductor substrate.

7. A semiconductor memory device comprising:
   at least one MOS transistor formed on a semiconductor substrate, said at least one MOS transistor having an island-shaped gate electrode formed on the semiconductor substrate with a gate insulating film and two diffusion regions formed in a surface of the semiconductor substrate at predetermined locations with the island-shaped gate electrode located therebetween;
   a capacitor formed in an interior space of an opening portion formed in the semiconductor substrate, said capacitor having a storage electrode connected to one of said diffusion regions through a connection electrode; and
   a word line connected to said island-shaped gate electrode of said MOS transistor, said island-shaped gate electrode being separated from a region where said opening portion is formed, wherein said word line is located at a different level above that of said island-shaped gate electrode and serves to connect said island-shaped gate electrode with at least one other gate electrode associated with another MOS transistor.

8. A semiconductor memory device comprising:
   a MOS transistor formed on a semiconductor substrate, and having a gate electrode formed on the semiconductor substrate with a gate insulating film and two diffusion regions formed in a surface of the semiconductor substrate at predetermined locations with the gate electrode located therebetween, said gate electrode being an island-shaped electrode separated from a region where an opening portion is formed in the semiconductor substrate adjacent to the MOS transistor;
   a capacitor formed in an interior space of said opening, said capacitor having a storage electrode connected to one of said diffusion regions;
   a connection electrode formed on said semiconductor substrate, and connected to one of said diffusion regions and said storage electrode;
   a first word line formed on said gate electrode of said MOS transistor; and
   a second word line formed above said connection electrode formed in the same level of said first word line.

9. A semiconductor memory device according to claim 8, wherein,
   said connection electrode is provided with an insulating film formed thereon.

10. A semiconductor memory device comprising:
    at least one MOS transistor formed on a semiconductor substrate said at least one MOS transistor having an island-shaped gate electrode formed on the semiconductor substrate with a first insulating film, two diffusion regions formed in a surface of the semiconductor substrate at predetermined locations with said gate electrode located therebetween, and a side wall insulation film provided on a side wall of said first insulating film and said island-shaped gate electrode, said side wall insulation film gradually decreasing in thickness in a direction away from the surface of said semiconductor substrate;
    a capacitor formed in an interior space of an opening portion which has an inner side wall;
    a connection electrode extending between one of said diffusion regions and said capacitor; and
    a word line connected to said island-shaped gate electrode of said at least one MOS transistor, said island-shaped gate electrode being separated from a region where said opening portion is formed, said word line having an upper surface and side surfaces covered with a second insulating film, wherein said word line serves to connect said island-shaped gate electrode with at least one other gate electrode associated with another MOS transistor.

11. A semiconductor memory device comprising:
    at least one MOS transistor formed on a semiconductor substrate, said at least one MOS transistor having an island-shaped gate electrode formed on the semiconductor substrate with a first insulating film and two diffusion regions formed in a surface of the semiconductor substrate at predetermined locations with the island-shaped gate electrode located therebetween;
    a second insulating film formed on an opening portion which has an inner side wall and being higher in level than said first insulating film;
    a capacitor formed in an interior space of said opening portion and comprising a storage electrode, an insulating film which includes a first capacitor insulating film and a second capacitor insulating film, and a plate electrode, said first capacitor insulating film being formed on said inner side wall of said opening portion and said second capacitor insulating film being continuously formed on said inner side wall of said opening portion formed in the semiconductor substrate and a portion of a side wall of said second insulating film;
    a word line connected to the island-shaped gate electrode of said at least one MOS transistor, wherein said word line is formed as a conductive layer located at a different level above that of said island-shaped gate electrode and wherein said word line serves to connect said island-shaped gate electrode with at least one other gate electrode associated with another MOS transistor; and
    a connection electrode extending between one of said diffusion regions and said storage electrode.

12. A semiconductor memory device comprising:

at least one MOS transistor formed on a semiconductor substrate, said at least one MOS transistor having an island-shaped gate electrode formed on said semiconductor substrate with a gate insulating film and two diffusion regions formed in a surface of the semiconductor substrate at predetermined locations with the island-shaped gate electrode located therebetween;

a capacitor formed in an interior space of an opening portion formed in said semiconductor substrate adjacent to said at least one MOS transistor;

a connection electrode extending between one of said diffusion regions and said capacitor; and a line layer connected to said island-shaped gate electrode of said at least one MOS transistor, said line layer being formed as a conductive layer at a different level above a level where said island-shaped gate electrode is formed.

13. A semiconductor memory device according to claim 12, wherein said connection electrode is formed only on said semiconductor substrate.

14. A semiconductor memory device according to claim 12, wherein said line layer forms a word line.

15. A semiconductor memory device according to claim 12, wherein said word line is formed to pass an upper portion of said opening portion.

16. A semiconductor memory device according to claim 12, wherein said capacitor has a capacitor insulating film which comes in contact with a storage electrode having a boundary surface formed of a metallic layer.

17. A semiconductor memory device comprising:

at least one MOS transistor formed on a semiconductor substrate, said at least one MOS transistor having an island-shaped gate electrode formed on the semiconductor substrate with a gate insulating film and two diffusion regions formed in a surface of the semiconductor substrate at predetermined locations with the island-shaped gate electrode located therebetween;

a capacitor formed in an interior space of an opening portion formed in said semiconductor substrate, said capacitor having a storage electrode electrically connected to one of said diffusion regions;

a connection electrode extending between one of said diffusion regions and said storage electrode;

a first word line connected to the island-shaped gate electrode of said at least one MOS transistor, wherein said first word line is formed as a conductive layer at a different level above a level where said island-shaped gate electrode is formed; and a second word line connected to respective gate electrodes of further MOS transistors, said second word line being formed above said connection electrode and further formed in a same level as said first word line.

18. A semiconductor memory device according to claim 17, wherein said connection electrode is formed only on said semiconductor substrate.

19. A semiconductor memory device comprising:

at least one MOS transistor formed on a semiconductor substrate, said MOS transistor having an island-shaped gate electrode formed on the semiconductor substrate with a first insulating film and two diffusion regions formed in a surface of the semiconductor substrate at predetermined locations with the gate electrode located therebetween, and a side wall insulation film provided on a side wall of said first insulating film and said island-shaped gate electrode, said side wall insulating film gradually decreasing in thickness in a direction away from the surface of said semiconductor substrate;

a capacitor formed in an interior space of an opening portion;

a connection electrode extending between one of said diffusion regions and said capacitor;

a first word line connected to said island-shaped gate electrode of said at least one MOS transistor, said first word line having an upper surface and side surfaces covered with a second insulating film; and a second word line formed above said connection electrode and further formed in a same level as said first word line.

20. A semiconductor memory device according to claim 19, wherein said connection electrode is formed only on said semiconductor substrate.

21. A semiconductor memory device comprising:

at least one MOS transistor formed on a semiconductor substrate, said MOS transistor having an island-shaped gate electrode formed on the semiconductor substrate with a gate insulating film and two diffusion regions formed in a surface of the semiconductor substrate at predetermined locations with the island-shaped gate electrode located therebetween;

a capacitor formed in an interior space of an opening portion formed in said semiconductor substrate adjacent to said at least one MOS transistor;

a first word line connected to said island-shaped gate electrode and including a line layer, wherein said first word line is formed as a conductive layer at a different level above a level where said island-shaped gate electrode is formed; and a second word line including a line layer that is provided above said capacitor and further formed in a same level as said first word line.

* * * * *